US008549209B2

(12) United States Patent
Pyeon et al.

(10) Patent No.: US 8,549,209 B2
(45) Date of Patent: Oct. 1, 2013

(54) BRIDGING DEVICE HAVING A CONFIGURABLE VIRTUAL PAGE SIZE

(75) Inventors: Hong Beom Pyeon, Ottawa (CA); Jin-Ki Kim, Ottawa (CA); Peter B. Gillingham, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 894 days.

(21) Appl. No.: 12/508,926

(22) Filed: Jul. 24, 2009

(65) Prior Publication Data

US 2010/0115214 A1 May 6, 2010

Related U.S. Application Data

(60) Provisional application No. 61/184,965, filed on Jun. 8, 2009, provisional application No. 61/111,013, filed on Nov. 4, 2008.

(51) Int. Cl.
*G06F 13/00* (2006.01)

(52) U.S. Cl.
USPC ................................ 711/5; 711/149; 711/154

(58) Field of Classification Search
USPC ................................................. 711/154, 151
See application file for complete search history.

(56) References Cited

U.S. PATENT DOCUMENTS 4,174,536 A 11/1979 Misunas et al.
4,613,953 A 9/1986 Bush et al.
4,899,316 A 2/1990 Nagami
5,038,299 A 8/1991 Maeda
5,204,669 A 4/1993 Dorfe et al.
5,243,703 A 9/1993 Farmwald et al.
5,404,460 A 4/1995 Thomsen et al.
5,430,859 A 7/1995 Norman et al.
5,440,694 A 8/1995 Nakajima
5,636,342 A 6/1997 Jeffries (Continued)

FOREIGN PATENT DOCUMENTS

CA 2310080 5/1999
EP 0910091 4/1999

(Continued)

OTHER PUBLICATIONS

PCT Patent Application No. PCT/CA2009/001552, International Search Report dated Feb. 3, 2010, p. 2.

(Continued)

*Primary Examiner* — Reba I Elmore
(74) *Attorney, Agent, or Firm* — Shin Hung; Borden Ladner Gervais LLP

(57) ABSTRACT

A composite memory device including discrete memory devices and a bridge device for controlling the discrete memory devices. The bridge device has memory organized as banks, where each bank is configured to have a virtual page size that is less than the maximum physical size of the page buffer. Therefore only a segment of data corresponding to the virtual page size stored in the page buffer is transferred to the bank. The virtual page size of the banks is provided in a virtual page size (VPS) configuration command having an ordered structure where the position of VPS data fields containing VPS configuration codes in the command correspond to different banks which are ordered from a least significant bank to a most significant bank. The VPS configuration command is variable in size, and includes only the VPS configuration codes for the highest significant bank being configured and the lower significant banks.

11 Claims, 17 Drawing Sheets

100

Memory Device 104
Memory Device 104
Local Device Interface
GLBCMD_IN
Bridge Device 102
GLBCMD_OUT
Local Device Interface
Memory Device 104
Memory Device 104

(56) References Cited

U.S. PATENT DOCUMENTS 5,729,683 A 3/1998 Le et al.
5,740,379 A 4/1998 Hartwig
5,761,146 A 6/1998 Yoo et al.
5,771,199 A 6/1998 Lee
5,777,488 A 7/1998 Dryer et al.
5,778,419 A 7/1998 Hansen et al.
5,794,000 A 8/1998 Furuta
5,802,399 A 9/1998 Yumoto et al.
5,802,555 A 9/1998 Shigeeda
5,806,070 A 9/1998 Norman et al.
5,828,899 A 10/1998 Richard et al.
5,859,809 A 1/1999 Kim
5,862,154 A 1/1999 Pawlowski
5,900,021 A 5/1999 Tiede et al.
5,937,206 A 8/1999 Nakamura
5,941,941 A 8/1999 Hasegawa
5,941,974 A 8/1999 Babin
5,953,538 A 9/1999 Duncan et al.
5,982,309 A 11/1999 Xi et al.
6,002,638 A 12/1999 John
6,009,479 A 12/1999 Jeffries
6,105,110 A * 8/2000 Watkins ........................ 711/135
6,144,576 A 11/2000 Leddige et al.
6,148,363 A 11/2000 Lofgren et al.
6,212,591 B1 4/2001 Kaplinsky
6,317,350 B1 11/2001 Pereira et al.
6,317,352 B1 11/2001 Halbert et al.
6,317,812 B1 11/2001 Lofgren et al.
6,453,365 B1 9/2002 Habot
6,567,904 B1 5/2003 Khandekar et al.
6,658,509 B1 12/2003 Bonella et al.
6,658,582 B1 12/2003 Han
6,665,742 B2 12/2003 Owen et al.
6,680,904 B1 1/2004 Kaplan et al.
6,697,906 B1 2/2004 Ayukawa et al.
6,763,426 B1 7/2004 James et al.
6,766,411 B2 7/2004 Goldshlag
6,768,431 B2 7/2004 Chiang
6,792,003 B1 9/2004 Potluri et al.
6,807,106 B2 10/2004 Gonzales et al.
6,919,736 B1 7/2005 Agrawal et al.
6,928,501 B2 8/2005 Andreas et al.
6,944,697 B2 9/2005 Andreas
6,950,325 B1 9/2005 Chen
6,961,882 B2 11/2005 Manfred et al.
6,996,644 B2 2/2006 Schoch et al.
7,031,221 B2 4/2006 Mooney et al.
7,093,076 B2 8/2006 Kyung
7,130,955 B2 10/2006 Azuma
7,130,958 B2 10/2006 Chou et al.
7,177,170 B2 2/2007 Gomm
7,254,075 B2 * 8/2007 Woo et al. ..................... 365/207
7,308,524 B2 12/2007 Grundy et al.
7,471,295 B2 12/2008 Van Koningsveld
7,599,975 B1 10/2009 Donovan et al.
7,957,173 B2 6/2011 Kim
8,060,705 B2 11/2011 Bowyer
8,108,648 B2 * 1/2012 Srinivasan et al. ............ 711/170
8,134,852 B2 3/2012 Kim et al.
2002/0103945 A1 8/2002 Owen et al.
2002/0114209 A1 * 8/2002 Koyanagi et al. ........ 365/230.03
2002/0161941 A1 10/2002 Chue et al.
2002/0188781 A1 12/2002 Schoch et al.
2003/0163606 A1 8/2003 Fukaishi et al.
2004/0001380 A1 1/2004 Becca et al.
2004/0186948 A1 9/2004 Lofgren et al.
2004/0186956 A1 9/2004 Perego et al.
2004/0230738 A1 11/2004 Lim et al.
2004/0236892 A1 11/2004 Zhu
2005/0086595 A1 4/2005 Campbell et al.
2005/0114613 A1 5/2005 Otani et al.
2005/0160218 A1 7/2005 See et al.
2005/0213421 A1 9/2005 Polizzi et al.
2005/0262289 A1 11/2005 Okuda
2006/0050594 A1 3/2006 Park
2006/0248305 A1 11/2006 Fang et al.
2007/0038852 A1 2/2007 Bovino et al.
2007/0076479 A1 4/2007 Kim et al.
2007/0076502 A1 4/2007 Pyeon et al.
2007/0109833 A1 5/2007 Pyeon et al.
2007/0143677 A1 6/2007 Pyeon et al.
2007/0153576 A1 7/2007 Oh et al.
2007/0157000 A1 7/2007 Qawami et al.
2007/0233903 A1 10/2007 Pyeon
2007/0234071 A1 10/2007 Pyeon
2007/0242552 A1 10/2007 Ju
2007/0263425 A1 11/2007 Ruckerbauer
2008/0016269 A1 1/2008 Chow et al.
2008/0019203 A1 1/2008 Ito et al.
2008/0049505 A1 2/2008 Kim et al.
2008/0052449 A1 2/2008 Kim et al.
2008/0080492 A1 4/2008 Pyeon et al.
2008/0123423 A1 5/2008 Kim
2008/0155219 A1 6/2008 Pyeon et al.
2008/0155370 A1 6/2008 Kadomatsu
2008/0198682 A1 8/2008 Pyeon
2008/0201548 A1 8/2008 Przybylski et al.
2008/0205187 A1 8/2008 Pyeon
2008/0215778 A1 9/2008 Sumi
2008/0235440 A1 9/2008 Le
2008/0235443 A1 9/2008 Chow et al.
2009/0021992 A1 1/2009 Oh
2009/0039927 A1 2/2009 Gillingham et al.
2009/0063786 A1 3/2009 Oh
2009/0103378 A1 4/2009 Schuetz et al.
2009/0129184 A1 5/2009 Schuetz
2009/0154285 A1 6/2009 Pyeon
2009/0154629 A1 6/2009 Pyeon et al.
2010/0005214 A1 1/2010 Trombley et al.
2010/0091536 A1 4/2010 Kim
2010/0091538 A1 4/2010 Kim et al.
2010/0115172 A1 5/2010 Gillingham et al.
2010/0115214 A1 5/2010 Pyeon

FOREIGN PATENT DOCUMENTS

EP 1587112 10/2005
WO 2006004166 A1 1/2006
WO 2006036811 A2 4/2006

OTHER PUBLICATIONS

Samsung Electronics, "1G x 8 Bit/ 2G x 8 Bit Nand Flash Memory, X9F8GO8UXM, Specification: ds_k9f8g08x0m_rev10.pclf", Mar. 31, 2007, pp. 1-54.

Schuetz et al., "Hyperlink Nand Flash Architecture for Mass Storage Applications," IEEE NVSMW, Aug., 2007, pp. 3-4.

Gillingham, "HLNAND: A New Standard for High Performance Flash Memory", Flash Memory Summit Power Point Slides Presentation, Aug. 13, 2008, pp. 1-18.

Ziaie, Kazem, "International Patent Application No. PCT/CA2009/001537, Search Report", Jan. 12, 2010, 6 pages.

"The 12C-Bus Specification Version 2.1", Philips Semiconductors, Document Order No. 9398 393 40011, 1-46, Jan. 1, 2000.

Shirota, R. et al, "A 2.3 UM2 Memory Cell Structure for 16MB Nand Eeproms, International Electron Devices Meeting 1990", Technical Digest; Dec. 1990, 103-106.

Samsung Electronics Co. Ltd., "256 M x 8 Bit/ 128M x 16 Bit/512M x 8 Bit Nand Flash Memory", K9K4GO8U1M, K9F2GO8UOM, K9F2G16UOM, Revision 1.0, 1-41, May 6, 2005.

Oshima, Y. et al, "High-Speed Memory Architectures for Multimedia Applications—Meeting the Requirements of Higher Performance", Circuits and Devices, IEEE 8755-3996/97, Jan. 1997, 8-13.

Samsung Electronics Co. Ltd., "1G x 8 Bit/2G x 8 Bit/ 4G x 8 Bit Nand Flash Memory", K9XXGO8UXA, 1-50, Jul. 18, 2006.

"Hypertransport TM I/O Link Specification, Revision 3.00a, Document #HTC20051222-0046-0017", 1-443, Nov. 22, 2006.

Tanaka, T. et al, "A Quick Intelligent Page-Programming Architecture and Shielded Bitline Sensing Method for 3 V-Only Nand Flash Memory, IEEE Journal of Solid-State Circuits", vol. 29, Issue 11, Nov. 1994, 1366-1373.

Takeuchi, K. et al, "A Multipage Cell Architecture for High-Speed Programming Multilevel Nand Flash Memories", IEEE Journal of Solid-State Circuits, vol. 33, Issue 8, Aug. 1998, 1228-1238.

Gjessing, Stein, "Performance of the Ramlink Memory Architecture", Proceedings of the Twenty-Seventh Annual Hawaii International Conference on System Sciences, IEEE 1060-3425/94, Jan. 1994, 154-162.
Suh, K. et al, "A 3.3 V 32 Mb Nand Flash Memory With Incremental Step Pulse Programming Scheme", IEEE Journal of Solid-State Circuits, Vol. 30, No. 11, Nov. 1995, 1149-1156.
Imamiya, K et al, "A 125-MM2 1-GB NAND Flash Memory With 10-Mbyte/S Program Speed", IEEE Journal of Solid-State Circuits, vol. 37, No. 11, Nov. 2002, 1493-1501.
Lee, June et al, "High-Performance 1-GB NAND Flash Memory With .012-Lm Technology", IEEE Journal of Solid-State Circuits, vol. 37, No. 11, Nov., 2002, 1502-1509.
Gjessing, S. et al, "A RAM Link for High Speed, Special Report/ Memory", IEEE Spectrum, Oct. 1992, 52-53.
Cho, T. et al, "A Dual-Mode NAND Flash Memory: 1GB Multilevel and High Performance 512-Mb Single-Level Modes", IEEE Journal of Solid-State Circuits, Vol. 36, No. 11, Nov. 2001, 1700-1706.
Toshiba, "16 GBIT (2G x 8BIT) CMOS NAND E2PROM (Multi-Level-Cell)", TC58NVG4D1DTGOO, 1-64, Nov. 9, 2006.
Kim, J. et al, "A 120-MM2 64-Mb NAND Flash Memory Achieving 180 NS/Byte Effective Program Speed", IEEE Journal of Solid-State Circuits, Vol. 32, No. 5, May 1997, 670-680,.
Tomita, N. et al, "A 62-NS 16 MB CMOS EEPROM With Voltage Stress Relaxation Technique", IEEE Journal of Solid-State Circuits Vol. 26, No. 11, Nov. 1991, 1593-1599.
"IEEE Standard for High-Bandwidth Memory Interface Based on Scalable Coherent Interface (SCI) Signaling Technology (RAMLINK), IEEE STD.", 1596.Apr. 1996, the Institute of Electrical Electronics Engineers, Inc., 98 pp., Mar. 19, 1996.
Momodomi, M. et al, "A 4MB NAND EEPROM With Tight Programmed VT Distribution", IEEE Journal of Solid-State Circuits, Vol. 26, Issue 4, Apr. 1991, 492-496.
Gjessing, Stein et al, "RAMLINK: A High-Bandwidth Point-To-Point Memory Architecture", Proceedings Compcom 1992, IEEE 0/8186-2655-0/92, 328-331, Feb. 24, 1992.
"8-Megabit 2.5 Volt Only or 2.7-Volt Only Data Flash", Technical Specification, Rev. 2225HDFLSH-10/04, AT45DB081B, Oct. 2004, 1-33.
Jung, T. et al, "A 117-MM2 3.3-V Only 128-Mb Multilevel NAND Flash Memory for Mass Storage Applications", IEEE Journal of Solid-State Circuits, vol. 31, No. 11, Nov. 1996, 1575-1583.
"2GBIT (256 X 8 Bits) CMOS NAND E2PROM", TH58NVG1S3AFT05, Toshiba Mos Digital Integrated Circuit Silicon Gate CMOS, 1-32, May 19, 2003.
"16 MBIT SPI Serial Flash, SST25VF016B", Preliminary Specification, Silicon Storage Technology Inc., Apr. 2005, 1-28.
Lee, June et al, "A 90-NM CMOS 1.8-V 2-GB Nand Flash Memory for Mass Storage Applications", IEEE Journal of Solid-State Circuits, vol. 38, No. 11, Nov. 2003, 1934-1942.
Aritome, S. et al, "A Reliable Bi-Polarity Write/Erase Technology in Flash Eeproms", Int'L. Electron Devices Meeting, Technical Digest, 111-114, Dec. 9, 1990.
Tanzawa, T. et al, "Circuit Techniques Fora 1.8-V-Only NAND Flash Memory", IEEE Journal of Solid-State Circuits, Vol. 37, No. 1, 84-89, Jan. 1, 2002.
"International Patent Application No. PCT/US2008/054307, Partial Search Annex to Form PCT/ISA/206", 1-5, Sep. 24, 2008.
Saito, S. et al, "A Programmable 8ONS 1MB CMOS EPROM, IEEE Isscc Digest of Technical Papers", 176-177, 340, Feb. 14, 1985.
Takeuchi, K. et al, "A 56NM CMOS 99MM2 8GB Multi-Level Nand Flash Memory With 10MB/S Program Throughput, Solid-State Circuits", 2006 IEEE International Conference Digest of Technical Papers, Session 7, ISBN:1-4244-0079-1, 10 pages, Feb. 6, 2006.
Byeon, D. et al, "An 8GB Multi-Level Nand Flash Memory With 63NM STI CMOS Process Technology", IEEE International Solid-State Circuits Conference, 46-47, Feb. 7, 2005.
Lee, S. et al, "A 3.3V 4GB Four-Level NAND Flash Memory With 90NM CMOS Technology", ISSCC 2004/Session 2NON-Volatile Memory/2.7, IEEE International Solid-State Circuits Conference, Digest of Technical Papers, vol. 1, XPO10722148, ISBN: 0-7803-8267-6, 10 pages, Feb. 16, 2004.
Choi, Young, "16-GBIT MLC NAND Flash Weighs in", Eeetimes.Com, http://www.eetimes.com/showArticle. jhtmlarticleID=201200825, 1-3, Jul. 30, 2007.
Kirisawa, R. et al, A NAND Structured Cell With a New Programming Technology for Highly Reliable 5V-Only Flash EEPROM, 1990 Symposium on VLSI Technology, CH 2874-6, 90/0000-0129 1990 IEEE, Honolulu, US, 129-130, Jun. 4, 1990.
"International Patent Application No. PCT/CA2009/001451, Search Report", 1-3, Dec. 17, 2009.
Samsung Electronics Co. Ltd., "2G x 8BIT Nand Flash Memory, K9XXGO8UXM; K9GAGO8UOM", 1-48, Sep. 21, 2006.
Hara, T. et al, "A 146-MM2 8-GB Multi-Level Nand Flash Memory With 70-NM CMOS Technology", IEEE Journal of Solid State Circuits, Vol. 41, No. 1, Jan. 2006, 161-169.
Tanzawa, T. et al, "A Dynamic Analysis of the Dickson Charge Pump Circuit", IEEE J. Solid-State Circuits, Vol. 32, No. 8, Aug. 1997, 1231-1240.
Ohtsuka, N. et al, "A 4-MBIT CMOS EPROM, IEEE Journal of Solid-State Circuits", Vol. 22, Issue 5, Oct. 1987, 669-675.
Samsung Electronics Co. Ltd., "512M x 8 Bit/ 1G x 8 Bit NAND Flash Memory, K9XXGO8UXA", 1-43, Mar. 7, 2006.
Gal, E. et al, "Algorithms and Data Structures for Flash Memories", ACM Computing Surveys (CSUR), Vol. 37, No. 2; Jun. 2005, 138-163.
Diamond, Steven L., "Synclink: High-Speed Dram for the Future", Micro Standards, IEEE Micro, Dec. 1996, 74-75.
Hara, T. et al, "A 146MM2 8GB Nand Flash Memory With 70NM CMOS Technology" ISSCC Session 2 Non-Volatile Memory 2.1, IEEE International Solid-State Circuits Conference, 44-45 and 584, Feb. 7, 2005.

* cited by examiner

BRIDGING DEVICE HAVING A CONFIGURABLE VIRTUAL PAGE SIZE

CROSS REFERENCE TO RELATED APPLICATIONS

This application claims the benefit of priority from U.S. Provisional Patent Application No. 61/184,965 filed Jun. 8, 2009, and from U.S. Provisional Patent Application No. 61/111,013 filed Nov. 4, 2008, the disclosures of which are expressly incorporated herein by reference in their entirety.

BACKGROUND

Semiconductor memory devices are important components in presently available industrial and consumer electronics products. For example, computers, mobile phones, and other portable electronics all rely on some form of memory for storing data. Many memory devices are available as commodity, or discrete memory devices, but also the need for higher levels of integration and higher input/output (I/O) bandwidth has led to the development of embedded memory, which can be integrated with systems, such as microcontrollers and other processing circuits.

Most consumer electronics employ, non-volatile devices, such as flash memory devices, for storage of data. Demand for flash memory devices has continued to grow significantly because these devices are well suited in various applications that require large amounts of non-volatile storage, while occupying a small physical area. For example, flash is widely found in various consumer devices, such as digital cameras, cell phones, universal serial bus (USB) flash drives and portable music players, to store data used by these devices. Also, flash devices are used as solid state drives (SSDs) for hard disk drive (HDD) replacement. Such portable devices are preferably minimized in form factor size and weight. Unfortunately, multimedia and SSD applications require large amounts of memory which can increase the form factor size and weight of their products. Therefore, consumer product manufacturers compromise by limiting the amount of physical memory included in the product to keep its size and weight acceptable to consumers. Furthermore, while flash memory may have a higher density per unit area than DRAM or SRAM, its performance is typically limited due to its relatively low I/O bandwidth that negatively impacts its read and write throughput.

In order to meet the ever-increasing demand for and ubiquitous nature of applications of memory devices, it is desirable to have high-performance memory devices, i.e., devices having higher I/O bandwidth, higher read and write throughput, and increased flexibility of operations.

SUMMARY

In a first aspect, there is provided a method for configuring page sizes for memory banks in a semiconductor device. The method includes identifying at least one memory bank of the memory banks to be configured; issuing a command including only configuration codes corresponding to the at least one memory bank; and configuring the page size of the least one memory bank in response to the configuration codes corresponding to the at least one memory bank. According to an embodiment, the memory banks are ordered from a least significant memory bank to a most significant memory bank, and the step of identifying includes identifying the highest significant memory bank of the at least one memory bank. In this present embodiment, the highest significant memory bank of the at least one memory bank corresponds to the least significant memory bank of the memory banks. In this present embodiment, the step of issuing can include providing a first configuration code corresponding to the least significant memory bank and a last configuration code corresponding to the highest significant memory bank. Furthermore, the step of issuing can include providing intermediate configuration codes corresponding to intervening memory banks between the least significant memory bank and the highest significant memory bank. Alternately, the step of issuing can include providing the first configuration code, the intermediate configuration codes and the last configuration code in a sequence corresponding to the ordering of the memory banks.

In this alternate embodiment, the first configuration code is provided first in time and the last configuration code is provided last in time. In yet another alternate embodiment, the step of issuing can include providing a header before the first configuration code, where the header includes a global device address followed by an op-code. Furthermore, the step of issuing can include driving a strobe signal to a first logic level at the beginning of the header and driving the strobe signal to a second logic level at the end of the last configuration code.

In a further alternate embodiment, the step of configuring includes latching the first configuration code, the intermediate configuration codes and the last configuration code in the semiconductor device. This step of configuring can further include time multiplexing the first configuration code, the intermediate configuration codes and the last configuration code onto a data bus. Then the step of latching can include latching each of the first configuration code, the intermediate configuration codes and the last configuration code on the data bus at different times. Alternately, the step of latching can include latching each of the first configuration code, the intermediate configuration codes and the last configuration code on the data bus synchronously with one of rising and falling edges a clock signal, and receiving a strobe signal at a first logic level to enable latching of the first configuration code, the intermediate configuration codes and the last configuration code. The strobe signal can be received at a second logic level to disable latching of data on the data bus.

In a second aspect, there is provided a circuit for latching page size configuration codes in a variable sized command. The circuit includes a data bus and a page size configurator. The data bus receives data corresponding to at least one of the page size configuration codes at different time periods. The page size configurator is coupled to the data bus for latching the data at the different time periods. The data includes either a portion of bits corresponding to one page size configuration code, or all bits corresponding to one page size configuration code. The different time periods correspond to clock cycles, and the page size configurator includes registers each having an input connected to the data bus for latching the data in response to pulsed signals received at different clock cycles.

According to an embodiment of the second aspect, the page size configurator includes domino activation logic for generating the pulsed signals in response to one of rising and falling edges of a clock signal. The domino activation logic can include latch signal generators connected in series with each other and enabled in sequence for generating the pulsed signals in response to one of the rising and falling edges of the clock signal. The domino activation logic includes a seed signal generator for enabling a first latch signal generator of the latch signal generators in response to a starting signal. Then each of the latch signal generators enables a subsequent latch signal generator after a corresponding pulsed signal is generated.

BRIEF DESCRIPTION OF THE DRAWINGS

Reference will now be made, by way of example, to the accompanying drawings.

DETAILED DESCRIPTION

Generally, at least some embodiments are directed to a composite memory device including discrete memory devices and a bridge device for controlling the discrete memory devices in response to global memory control signals having a format or protocol that is incompatible with the memory devices. The discrete memory devices can be commercial off-the-shelf memory devices or custom memory devices, which respond to native, or local memory control signals. The global and local memory control signals include commands and command signals each having different formats.

To improve overall read and write performance of the composite memory device relative to the discrete memory devices, the bride device is configured to receive write data and to provide read data at a frequency greater than the maximum rated frequency of the discrete memory devices. For the purposes of describing the present embodiments, a write operation and a program operation are treated as analogous functions, since in both cases data is stored in the cells of the memory. However, the discrete memory devices within the composite memory device operate cannot provide its read data fast enough to the bridge device in real time so that the bridge device can output the read data at its higher data rate. Therefore to compensate for this mismatch in speed, the bridge device includes virtual page buffers to temporarily store at least a portion of a page of data read from the page buffer of a discrete memory device, or to be written to the page buffer of a discrete memory device.

The system and device in accordance with the techniques described herein are applicable to a memory system having a plurality of devices connected in series. The devices are, for example, memory devices, such as dynamic random access memories (DRAMs), static random access memories (SRAMs), flash memories, DiNOR Flash EEPROM memories, Serial Flash EEPROM memories, Ferro RAM memories, Magneto RAM memories, Phase Change RAM memories, and any other suitable type of memory.

Following are descriptions of two different memory devices and systems to facilitate a better understanding of the later described composite memory device and bridge device embodiments.

Figure 1A:
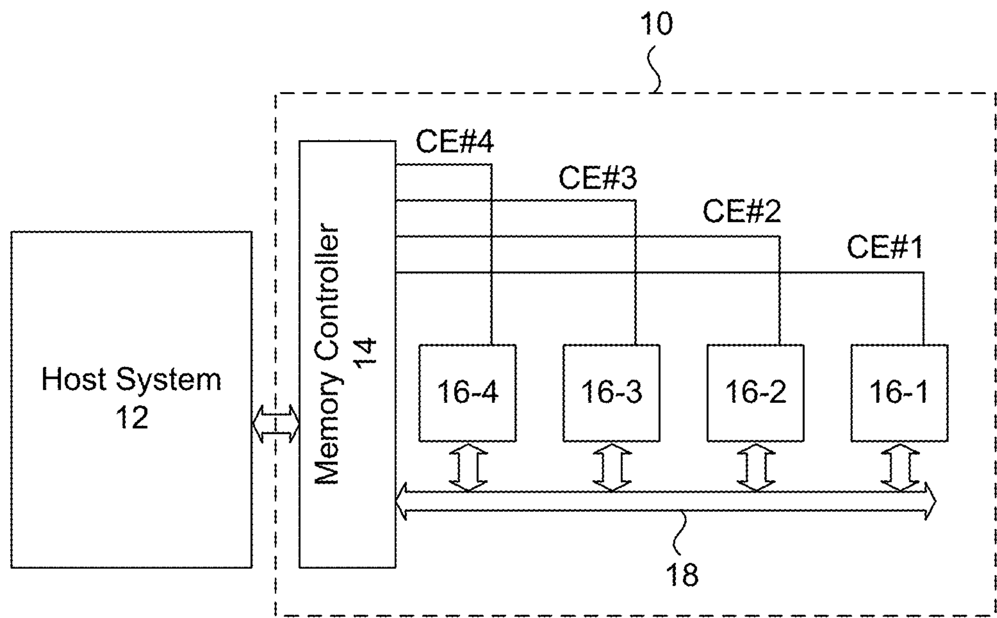
FIG. 1A is a block diagram of an example non-volatile memory system.

FIG. 1A is a block diagram of a non-volatile memory system 10 integrated with a host system 12. The system 10 includes a memory controller 14 in communication with host system 12, and a plurality of non-volatile memory devices 16-1, 16-2, 16-3 and 16-4. For example the non-volatile memory devices 16-1-16-4 can be discrete asynchronous flash memory devices. The host system 12 includes a processing device such as a microcontroller, microprocessor, or a computer system. The system 10 of FIG. 1A is organized to include one channel 18, with the memory devices 16-1-16-4 being connected in parallel to channel 18. Those skilled in the art should understand that the system 10 can have more or fewer than four memory devices connected to it. In the presently shown example, the memory devices 16-1-16-4 are asynchronous and connected in parallel with each other.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. In this and following examples, the "#" indicates that the signal is an active low logic level signal (ie. logic "0" state). In this scheme, one of the chip select signals is typically selected at one time to enable a corresponding one of the non-volatile memory devices 16-1-16-4. The memory controller 14 is responsible for issuing commands and data, via the channel 18, to a selected memory device in response to the operation of the host system 12. Read data output from the memory devices is transferred via the channel 18 back to the memory controller 14 and host system 12. The system 10 is generally said to include a multi-drop bus, in which the memory devices 16-1-16-4 are connected in parallel with respect to channel 18.

Figure 1B:
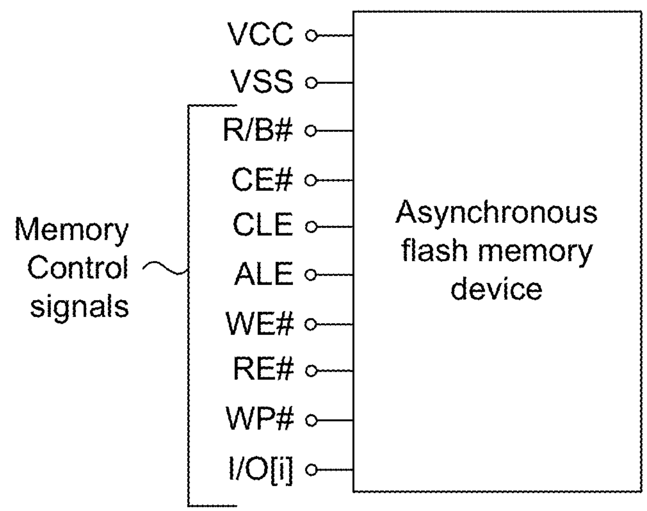
FIG. 1B is a diagram of a discrete flash memory device used in the example memory system of FIG. 1A.

FIG. 1B is a diagram of one of the discrete flash memory devices 16-1-16-4 which can be used in the memory system of FIG. 1A. This flash memory device includes several input and output ports, which include for example power supply, control ports and data ports. The term "ports" refers to a generic input or output terminals into the memory device, which includes package pins, package solder bumps, chip bond pads, and wireless transmitters and receivers for example. The power supply ports include VCC and VSS for supplying power to all the circuits of the flash memory device. Additional power supply ports can be provided for supplying only the input and output buffers, as is well known in the art. Table 1 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application. It is noted that that package pins and ball grid arrays are physical examples of a port, which is used for interconnecting signals or voltages of a packaged device to a board. The ports can include other types of connections, such as for example, terminals and contacts for embedded and system-in-package (SIP) systems.

TABLE 1

| Port | Description |
| --- | --- |
| R/B# | Ready/Busy: the R/B# is open drain port and the output signal is used to indicate the operating condition of the device. The R/B# signal is in Busy state (R/B# = LOW) during the Program, Erase and Read operations and will return to Ready state (R/B# = HIGH) after completion of the operation. |
| CE# | Chip Enable: the device goes into a low-power Standby mode when CE# goes HIGH during the device is in Ready state. The CE# signal is ignored when device is in Busy state (R/B# = LOW), such as during a Program or Erase or Read operation, and will not enter Standby mode even if the CE# input goes HIGH |
| CLE | Command Latch Enable: the CLE input signal is used to control loading of the operation mode command into the internal command register. The command is latched into the command register from the I/O port on the rising edge of the WE# signal while CLE is HIGH. |
| ALE | Address Latch Enable (ALE): the ALE signal is used to control loading address information into the internal address register. Address information is latched into the address register from the I/O port on the rising edge of the WE# signal while ALE is HIGH. |
| WE# | Write Enable: the WE# signal is used to control the acquisition of data from the I/O port. |
| RE# | Read Enable: the RE signal controls serial data output. Data is available after the falling edge of RE#. |
| WP# | Write Protect: the WP# signal is used to protect the device from accidental programming or erasing. The internal voltage regulator (high voltage generator) is reset when WP# is LOW. This signal is usually used for protecting the data during the power-on/off sequence when input signals are invalid. |
| I/O[i] | I/O Port: are used as a port for transferring address, command and input/output data to and from the device. Variable n can be any non-zero integer value. |

All the signals noted in Table 1 are generally referred to as the memory control signals for operation of the example flash memory device illustrated in FIG. 1B. It is noted that the last port I/O[i] is considered a memory control signal as it can receive commands which instruct the flash memory device to execute specific operations. Because a command asserted on port I/O[i] is a combination of logic states applied to each individual signal line making up I/O[i], the logic state of each signal of I/O[i] functions in the same manner as one of the other memory control signals, such as WP# for example. The main difference being that a specific combination of I/O[i] logic states controls the flash memory device to perform a function. The commands are received via its I/O ports and the command signals include the remaining control ports. Those skilled in the art understand that operational codes (op-codes) are provided in the command for executing specific memory operations. With the exception of the chip enable CE#, all the other ports are coupled to respective global lines that make up channel 18. All the ports are controlled in a predetermined manner for executing memory operations. This includes signal timing and sequencing of specific control signals while address, command and I/O data is provided on the I/O ports. Therefore, the memory control signals for controlling the asynchronous flash memory device of FIG. 1B has a specific format, or protocol.

Each of the non-volatile memory devices of FIG. 1A has one specific data interface for receiving and providing data. In the example of FIG. 1A, this is a parallel data interface commonly used in asynchronous flash memory devices, as well as in some synchronous flash memory devices such as those specified in the ONFi 2.0 standard. Standard parallel data interfaces providing multiple bits of data in parallel are known to suffer from well known communication degrading effects such as cross-talk, signal skew and signal attenuation, for example, which degrades signal quality, when operated beyond their rated operating frequency.

In order to increase data throughput, a memory device having a serial data interface has been disclosed in commonly owned U.S. Patent Publication No. 20070153576 entitled "Memory with Output Control", and commonly owned U.S. Patent Publication No. 20070076502 entitled "Daisy Chain Cascading Devices" which receives and provides data serially at a frequency, for example, 200 MHz. This is referred to as a serial data interface format. As shown in these commonly owned patent publications, the described memory device can be used in a system of memory devices that are serially connected to each other.

Figure 2A:
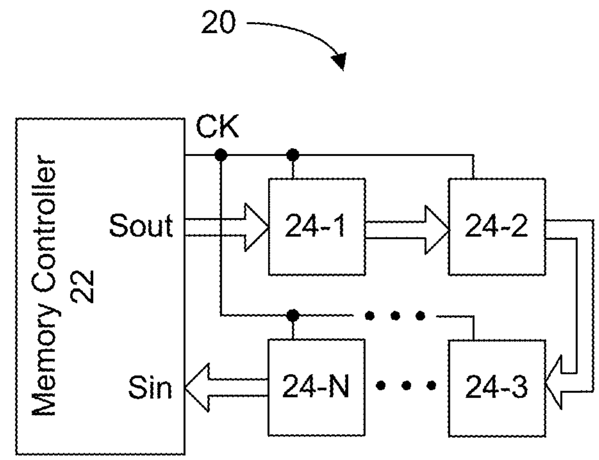
FIG. 2A is a block diagram of an example serial memory system.

FIG. 2A is a block diagram illustrating the conceptual nature of a serial memory system. In FIG. 2A, the serial ring-topology memory system 20 includes a memory controller 22 having a set of output ports Sout and a set of input ports Sin, and memory devices 24-1, 24-2, 24-3 and 24-N that are connected in series. The memory devices can be serial interface flash memory devices for example. While not shown in FIG. 2A, each memory device has a set of input ports Sin and a set of output ports Sout. These sets of input and output ports includes one or more individual input/output (I/O) ports, such as physical pins or connections, interfacing the memory device to the system it is a part of. In one example, the memory devices can be flash memory devices. Alternately, the memory devices can be DRAM, SRAM, DiNOR Flash EEPROM, Serial Flash EEPROM, Ferro RAM, Magneto RAM, Phase Change RAM, or any other suitable type of memory device that has an I/O interface compatible with a specific command structure, for executing commands or for passing commands and data through to the next memory device. The current example of FIG. 2A includes four memory devices, but alternate configurations can include a single memory device, or any suitable number of memory devices. Accordingly, if memory device 24-1 is the first device of the system 20 as it is connected to Sout, then memory device 24-N is the Nth or last device as it is connected to Sin, where N is an integer number greater than zero. Memory devices 24-2, 24-3 and any memory devices between 24-3 and 24-N are then intervening serially connected memory devices between the first and last memory devices. In the example of FIG. 2A, the memory devices 24-1 to 24-N are synchronous and connected in series with each other and the memory controller 22.

Figure 2B:
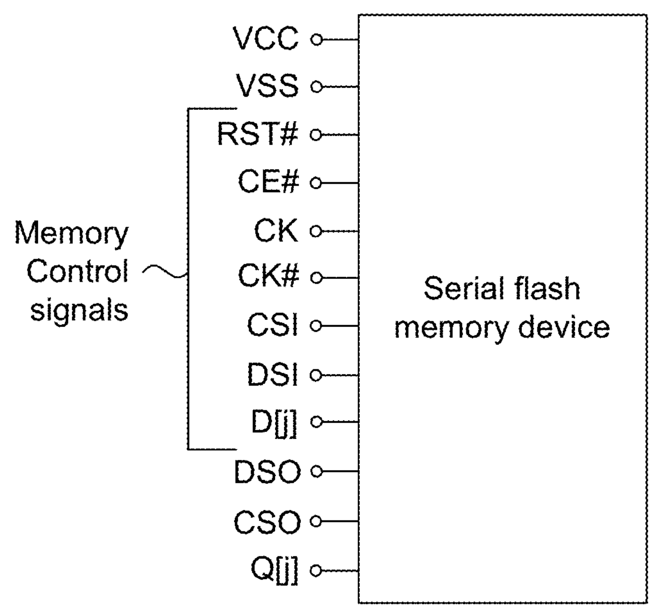
FIG. 2B is a diagram of a discrete serial interface flash memory device used in the example memory system of FIG. 2A.

FIG. 2B is a diagram of the serial interface flash memory device (24-1 to 24-N for example) which can be used in the memory system of FIG. 2A. This example serial interface flash memory device includes power supply ports, control ports and data ports. The power supply ports include VCC and VSS for supplying power to all the circuits of the flash memory device. Additional power supply ports can be provided for supplying only the input and output buffers, as is well known in the art. Table 2 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application.

TABLE 2

| Port | Description |
|---|---|
| CK/ CK# | Clock: CK is the system clock input. CK and CK# are differential clock inputs. All commands, addresses, input data and output data are referenced to the crossing edges of CK and CK# in both directions. |
| CE# | Chip Enable: When CE# is LOW, the device is enabled. Once the device starts a Program or Erase operation, the Chip Enable port can be de-asserted. In addition, CE# LOW activates and CE# HIGH deactivates the internal clock signals. |
| RST# | Chip Reset: RST# provides a reset for the device. When RST# is HIGH, the device is on the normal operating mode. When RST# is LOW, the device will enter the Reset mode. |
| D[j] | Data Input: (j = 1, 2, 3, 4, 5, 6, 7 or 8) receives command, address and input data. If the device is configured in '1-bit Link mode (=default)', D1 is the only valid signal and receives one byte of packet in 8 crossings of CK/CK#. If the device is configured in '2-bit Link mode', D1 & D2 are only valid signals and receive one byte of packet in 4 crossings of CK/CK#. Unused input ports are grounded. |
| Q[j] | Data Output: (j = 1, 2, 3, 4, 5, 6, 7 or 8) transmits output data during read operation. If device is configured in '1-bit Link mode (=default)', Q1 is the only valid signal and transmits one byte of packet in 8 crossings of CK/CK#. If the device is configured in '2-bit Link mode', Q1 & Q2 are the only valid signals and transmit one byte of packet in 4 crossings of CK/CK#. Unused output ports are DNC (=Do Not Connect). |
| CSI | Command Strobe Input: When CSI is HIGH, command, address and input data through D[j] are latched on the crossing of CK and CK#. When CSI is LOW, the device ignores input signals from D[j]. |
| CSO | Command Strobe Output: The echo signal CSO is a re-transmitted version of the source signal CSI. |
| DSI | Data Strobe Input: Enables the Q[j] buffer when HIGH. When DSI is LOW, the Q[j] buffer holds the previous data accessed. |
| DSO | Data Strobe Output: The echo signal DSO is a re-transmitted version of the source signal DSI. |

With the exception of signals CSO, DSO and Q[j], all the signals noted in Table 2 are the memory control signals for operation of the example flash memory device illustrated in FIG. 2B. CSO and DSO are retransmitted versions of CSI and DSI, and Q[j] is an output for providing commands and data. The commands are received via its D[j] ports and the command signals include the control ports RST#, CE#, CK, CK#, CSI and DSI. In the example configuration shown in FIG. 2A, all signals are passed serially from the memory controller 22 to each memory device in series, with the exception of CE# and RST#, which are provided to all the memory devices in parallel. The serial interface flash memory device of FIG. 2B thus receives memory control signals having its own format or protocol, for executing memory operations therein.

Further details of the serially connected memory system of FIG. 2 are disclosed in commonly owned U.S. Patent Publication No. 20090039927 entitled "Clock Mode Determination in a Memory System" filed on Feb. 15, 2008, which describes a serial memory system in which each memory device receives a parallel clock signal, and a serial memory system in which each memory device receives a source synchronous clock signal.

Having both the commonly available asynchronous flash memory devices of FIG. 1B and the serial interface flash memory devices of FIG. 2B allows a memory system manufacturer to provide both types of memory systems. However, this will likely introduce higher cost to the memory system manufacturer since two different types of memory devices must be sourced and purchased. Those skilled in the art understand that the price per memory device decreases when large quantities are purchased, hence large quantities are purchased to minimize the cost of the memory system. Therefore, while a manufacturer can provide both types of memory systems, it bears the risk of having one type of memory device fall out of market demand due the high market demand of the other. This may leave them with purchased supplies of a memory device that cannot be used.

As shown in FIG. 1B and FIG. 2B, the functional port assignments or definitions of the asynchronous and serial interface flash memory devices are substantially different from each other, and are accordingly, incompatible with each other. The functional port definitions and sequence, or timing, of sets of signals used for controlling the discrete memory devices is referred to as a protocol or format. Therefore the asynchronous and serial flash memory devices operate in response to different memory control signal formats. This means that the serial interface flash memory device of FIG. 2B cannot be used in a multi-drop memory system, and correspondingly, the asynchronous flash memory device of FIG. 1B cannot be used in a serial connected ring topology memory system.

Although serial interface flash memory devices as shown in FIG. 2A and FIG. 2B are desirable for their improved performance over the asynchronous flash memory devices of FIGS. 1A and 1B, memory system manufacturers may not wish to dispose of their supplies of asynchronous flash memory devices. Furthermore, due to their ubiquitous use in the industry, asynchronous flash memory devices are inexpensive to purchase relative to alternative flash memory devices such as the serial interface flash memory device of FIG. 2A. Presently, memory system manufacturers do not have a solution for taking advantage of the performance benefits of serially interconnected devices with minimal cost overhead.

At least some example embodiments described herein provide a high performance composite memory device with a high-speed interface chip or a bridge device in conjunction with discrete memory devices, in a multi-chip package (MCP) or system in package (SIP). The bridge device provides an I/O interface with the system it is integrated within, and receives global memory control signals following a global format, and converts the commands into local memory control signals following a native or local format compatible with the discrete memory devices. The bridge device thereby allows for re-use of discrete memory devices, such as NAND flash devices, while providing the performance benefits afforded by the I/O interface of the bridge device. The bridge device can be embodied as a discrete logic die integrated with the discrete memory device dies in the package.

In the present examples, the global format is a serial data format compatible with the serial flash memory device of FIGS. 2A and 2B, and the local format is a parallel data format compatible with the asynchronous flash memory device of FIGS. 1A and 2B. However, the embodiments of the present invention are not limited to the above example formats, as any pair of memory control signal formats can be used, depending the type of discrete memory devices used in the composite memory device and the type of memory system the composite memory device is used within. For example, the global format of the memory system can follow the Open NAND Flash Interface (ONFi) standard, and the local format can follow the asynchronous flash memory device memory control signal format. For example, on specific ONFi standard is the ONFi 2.0 Specification. Alternatively, the global format can follow the asynchronous flash memory device memory control signal format and the local format can follow the ONFi 2.0 Specification format.

Figure 3A:
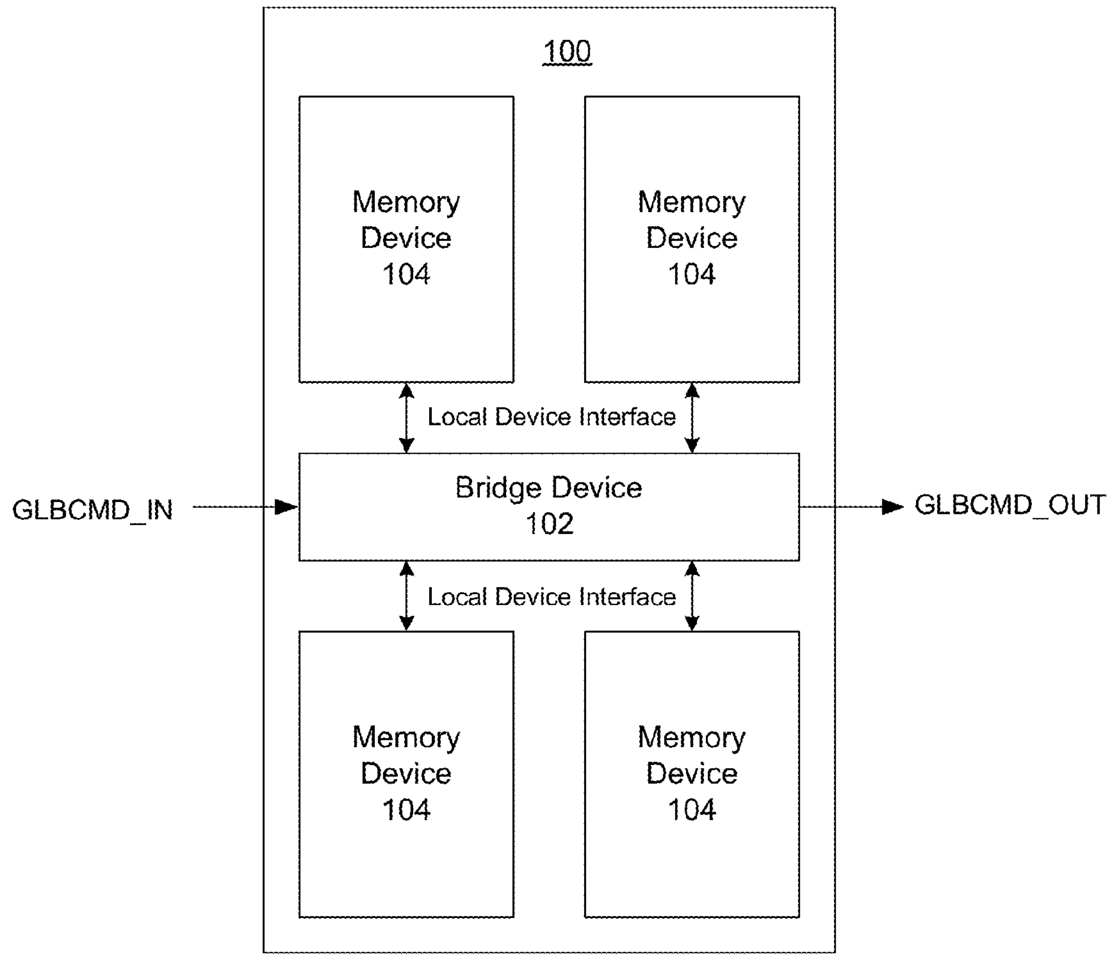
FIG. 3A is a block diagram of a composite memory device having four discrete memory devices and a bridge device in accordance with an embodiment.

FIG. 3A is a block diagram of a composite memory device, according to a present embodiment. As shown in FIG. 3A, composite memory device 100 includes a bridge device 102 connected to four discrete memory devices 104. Each of the discrete memory devices 104 can be asynchronous flash memory devices having a memory capacity of 8 Gb, for example, but any capacity discrete flash memory device can be used instead of 8 Gb devices. Furthermore, composite memory device 100 is not limited to having four discrete memory devices. Any number of discrete memory devices can be included, when bridge device 102 is designed to accommodate the maximum number of discrete memory devices in the composite memory device 100.

Figure 3B:
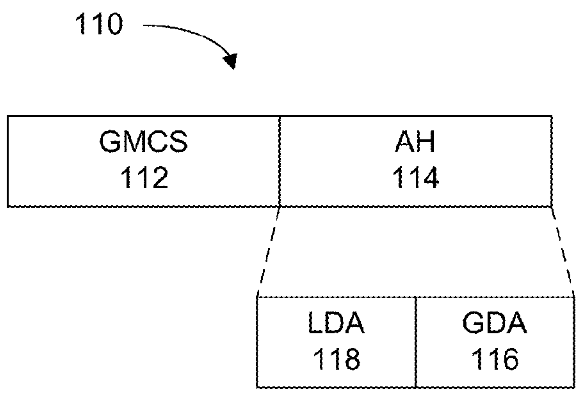
FIG. 3B is an illustration of a global command, according to a present embodiment.

Composite memory device 100 has an input port GLBCMD_IN for receiving a global command, and an output port GLBCMD_OUT for passing the received global command and read data. FIG. 3B is a schematic illustrating the hierarchy of a global command, according to a present embodiment. The global command 110 includes global memory control signals (GMCS) 112 having a specific format, and an address header (AH) 114. These global memory control signals 112 provide a memory command and command signals, such as the memory control signals for the serial interface flash memory device of FIG. 2B. The address header 114 includes addressing information used at the system level and the composite memory device level. This additional addressing information includes a global device address (GDA) 116 for selecting a composite memory device to execute an op-code in the memory command, and a local device address (LDA) 118 for selecting a particular discrete device within the selected composite memory device to execute the op-code. In summary, the global command includes all the memory control signals corresponding to one format, and further addressing information which may be required for selecting or controlling the composite memory device or the discrete memory devices therein.

It is noted that bridge device 102 does not execute the op-code or access any memory location with the row and address information. The bridge device 102 uses the global device address 116 to determine if it is selected to convert the received global memory control signals 112. If selected, bridge device 102 then uses the local device address 118 to determine which of the discrete memory devices the converted global memory control signals 112 is sent to. In order to communicate with all four discrete memory devices 104, bridge device 102 includes four sets of local I/O ports (not shown), each connected to a corresponding discrete memory device, as will be discussed later. Each set of local I/O ports includes all the signals that the discrete memory device requires for proper operation, and thereby functions as a local device interface.

Read data is provided by any one of a flash memory device 104 from composite memory device 100, or from a previous composite memory device. In particular, the bridge device 102 can be connected to a memory controller of a memory system, or to another bridge device of another composite memory device in a system of serially interconnected devices. The input port GLBCMD_IN and output port GLBCMD_OUT can be package pins, other physical conductors, or any other circuits for transmitting/receiving the global command signals and read data to and from the composite memory device 100, and in particular, to and from bridge device 102. The bridge device 102 therefore has corresponding connections to the input port GLBCMD_IN and the output port GLBCMD_OUT to enable communication with an external controller, such as memory controller 22 of FIG. 2A, or with the bridge devices from other composite memory devices in the system. As will be shown in the example embodiment of FIG. 7, many composite memory devices can be connected serially to each other.

Figure 4:
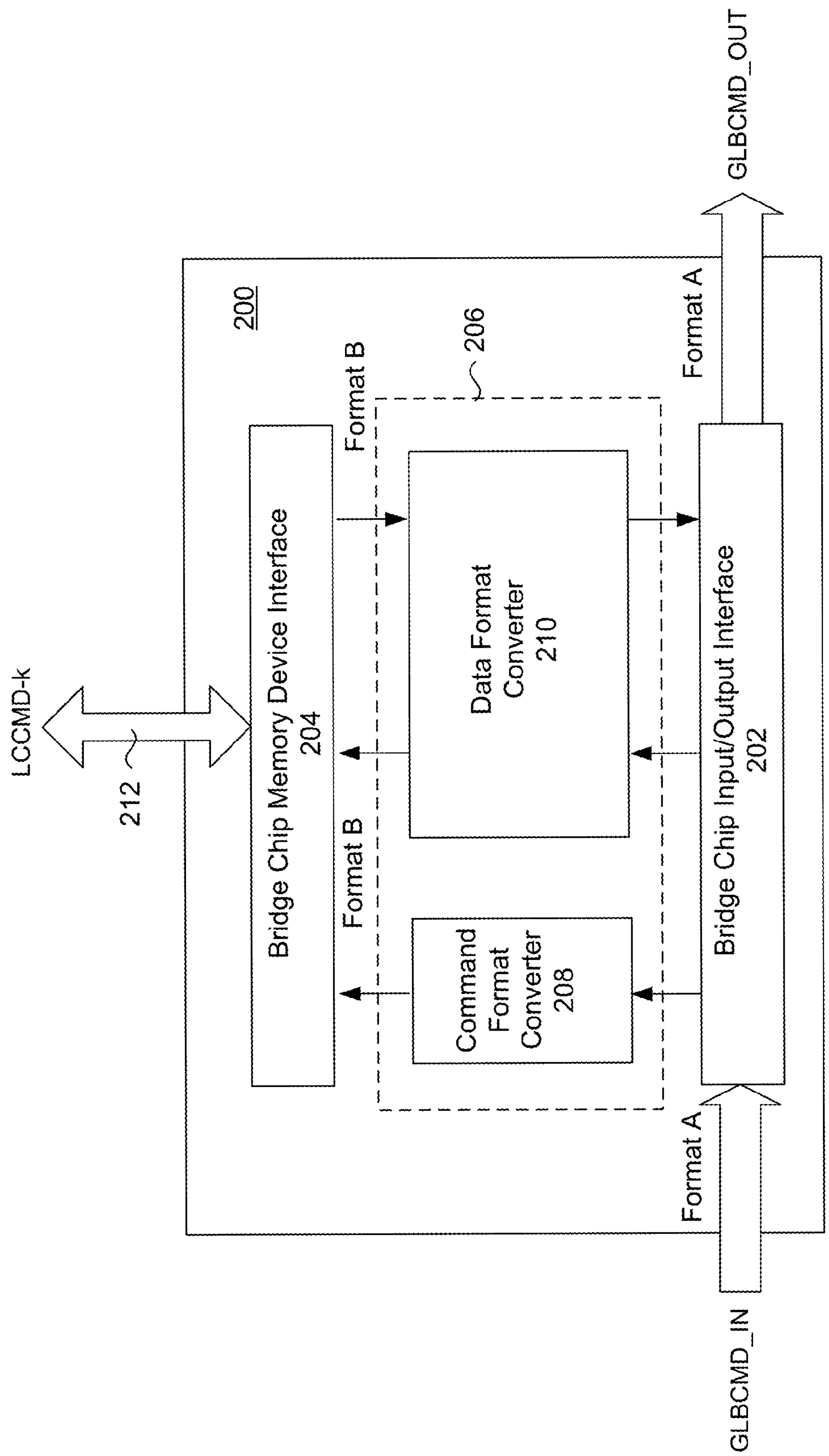
FIG. 4 is a block diagram of a bridge device in accordance with an embodiment.

FIG. 4 is a block diagram of a bridge device 200 in accordance with an embodiment, which corresponds to the bridge device 102 shown in FIG. 3A. The bridge device 200 has a bridge device input/output interface 202, a memory device interface 204, and a format converter 206. The format converter 206 includes a command format converter 208 for converting global memory control signals, which include global commands and global command signals in a first format to a second format, and a data format converter 210 for converting data between the first format and the second format. The command format converter 208 further includes a state machine (not shown) for controlling the discrete memory devices, such as discrete memory devices 104 of FIG. 3A in accordance with the second format in response to the global memory control signals in the first format.

The bridge device input/output interface 202 communicates with external devices, such as for example, with a memory controller or another composite memory device. The bridge device input/output interface 202 receives global commands from a memory controller or another composite memory device in the global format, such as for example in a serial command format. With further reference to FIG. 3B, logic in the input/output interface 202 processes the global device address 116 of the global command 110 to determine if the global command 110 is addressed to the corresponding composite memory device, and processes the local device address 118 in the global command 110 to determine which of the discrete memory devices of the corresponding composite memory device is to receive the converted command, which includes an op-code and optional row and column addresses and optional write data. If the global command is addressed to a discrete memory device connected to bridge device 200, the command format converter 208 in the format converter 206 converts the global memory control signals 112, which provides the op-code and command signals and any row and address information from the global format to the local format, and forwards it to the memory device interface 204. If write data is provided to bridge device input/output interface 202 in a serial data format for example, then bridge device input/output interface 202 includes serial-to-parallel conversion circuitry for providing bits of data in parallel format. For read operations, bridge device input/output interface 202 includes parallel-to-serial conversion circuitry for providing bits of data in serial format for output through the GLBCMD_OUT output port.

It is assumed that the global format and the local format are known, hence logic in command format converter 208 is specifically designed to execute the logical conversion of the signals to be compatible with the discrete memory devices 104. It is noted that command format converter 208 can include control logic at least substantially similar to that of a memory controller of a memory system, which is used for controlling the discrete memory devices with memory control signals having a native format. For example, command format converter 208 may include the same control logic of memory controller 14 of FIG. 1A if the discrete memory devices are asynchronous memory devices, such as memory devices 16-1 to 16-4. This means that the control logic in command format converter 208 provides the timing and sequencing of the memory control signals in the local format native to the discrete memory devices.

If the global command corresponds to a data write operation, the data format converter 210 in the format converter 206 converts the data from the global format to the local format, and forwards it to the memory device interface 204. The bits of read or write data do not require logical conversion, hence data format converter 210 ensures proper mapping of the bit positions of the data between the first data format and the second data format. Format converter 206 functions as a data buffer for storing read data from the discrete memory devices or write data received from the bridge device input/output interface 202. Therefore, data width mismatches between the global format and the local format can be accommodated. Furthermore, different data transmission rates between the discrete memory devices and the bridge device 200, and the bridge device 200 and other composite memory devices are accommodated due to the buffering functionality of data format converter 210.

The memory device interface 204 then forwards or communicates the converted command in the local command format to the discrete memory device selected by the local device address 118 in the global command 110 of FIG. 3B. In the present embodiment, the converted command is provided via a command path 212. In an embodiment, command path 212 includes i sets of dedicated local I/O ports LCCMD-k, or channels, connected between each discrete memory device in the composite memory device and the memory device interface 204. The variable i is an integer number corresponding to the number of discrete memory devices in the composite memory device. For example, each LCCMD-k channel includes all the ports shown in FIG. 1B and Table 1.

Following is a description of example operations of bridge device 200, with further reference to the composite memory device 100 of FIG. 3A. For a read operation, a global command is received, such as a global read command arriving at the bridge device input/output interface 202 through input port GLBCMD_IN. This global read command includes the global memory control signals that provide an op-code and row and column information in the global format, for data to be read out from a discrete memory device 104 connected to the bridge device 200. Once the bridge device input/output interface 202 determines that it has been selected for the global read command by comparing the global device address 116 to a predetermined address of the composite memory device 100, the command format converter 208 converts the global read command into the local format compatible with the discrete memory device 104 on which the read data command is to be executed. As will be described later, the composite memory device can have an assigned address. The local device address 118 of the global read command is forwarded to the memory device interface 204, and the converted read data command is provided to the discrete memory device addressed by the local device address via a corresponding set of local I/O ports of the command path 212.

Data referred to as read data, is read from the selected discrete memory device 104 and provided to the data format converter 210 via the same local I/O ports of memory device interface 204 in the local format. The data format converter 210 then converts the read data from the local format to the global format and provides the read data from the selected discrete memory device 104 to the memory controller through output port GLBCMD_OUT of bridge device interface 202. Bridge device interface 202 includes internal switching circuitry for coupling either the read data from data format converter 210 or the input port GLBCMD_IN to the output port GLBCMD_OUT.

Figure 5:
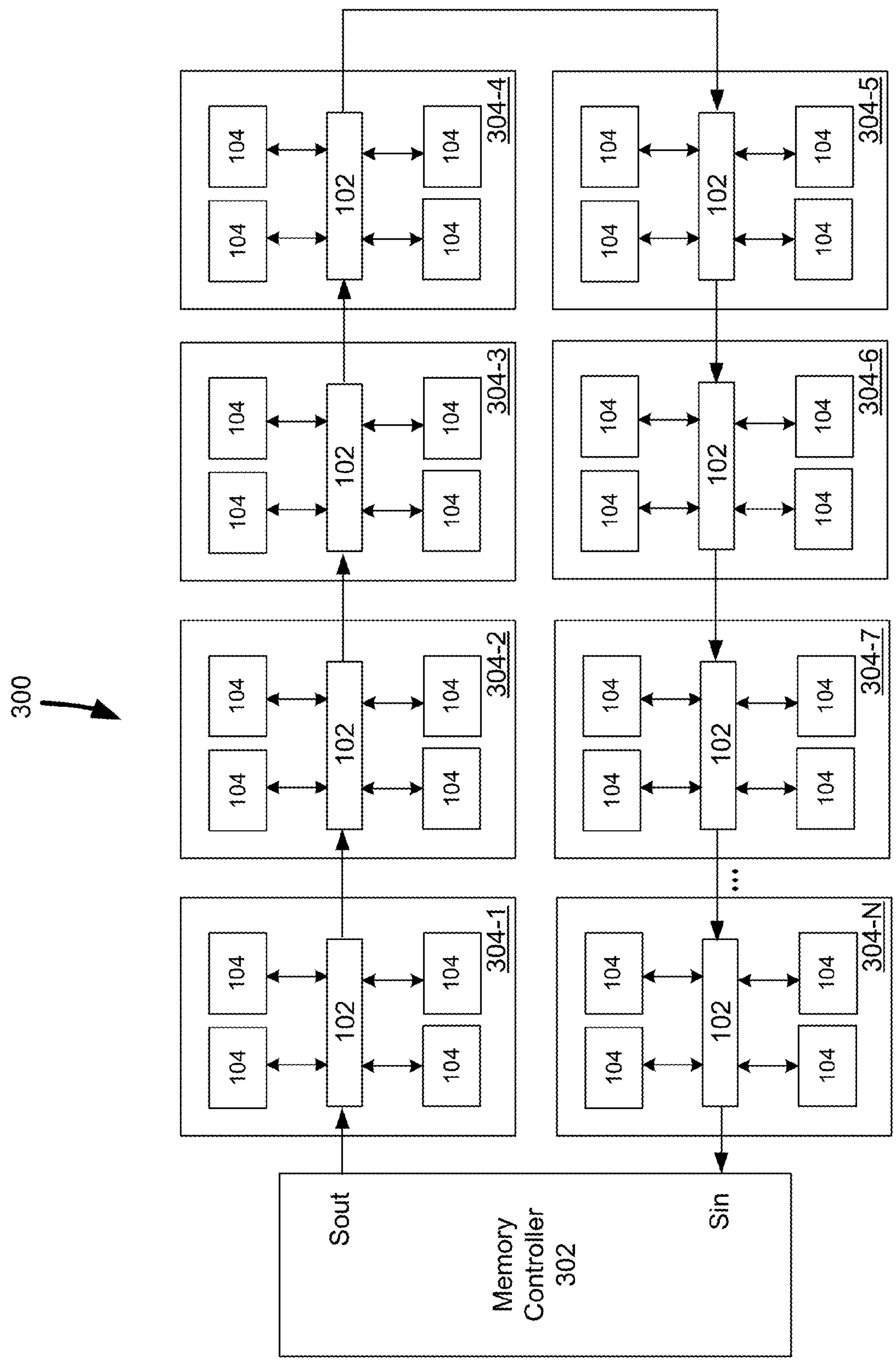
FIG. 5 is a block diagram of a memory system having a number of composite memory devices connected to a controller in a serial interconnected memory system in accordance with an embodiment.

FIG. 5 is a memory system having a plurality of composite memory devices connected in series in a ring topology with a memory controller, according to a present embodiment. In the present example, each of the shown composite memory devices has the architecture shown in FIG. 3A, which can have the bridge device 200 of FIG. 4. Memory system 300 of FIG. 5 is similar to the serial memory system 20 of FIG. 2A. Memory system 300 includes a memory controller 302 and composite memory devices 304-1 to **304-*j*, where j is an integer number. The individual composite memory devices 304-1-304-*j* are serially interconnected with the memory controller 302. Similar to system 20 of FIG. 2A, composite memory device 304-1 is the first composite memory device of memory system 300 as it is connected to an output port Sout of memory controller 302, and memory device 304-*n* is the last device as it is connected to an input port Sin of memory controller 302. Composite memory devices 304-2 to 304-7** are then intervening serially connected memory devices connected between the first and last composite memory devices. The Sout port provides a global command in a global format. The Sin port receives read data in the global format, and the global command as it propagates through all the composite memory devices.

Each of the composite memory devices shown in FIG. 5 is similar to the composite memory device 100 shown in FIG. 3A. Each of the composite memory devices has a bridge device 102 and four discrete memory devices 104. As was previously described, each bridge device 102 in each of the composite memory device is connected to respective discrete memory devices 104, and to either the memory controller 302 and/or a previous or subsequent composite memory device in the serial-ring topology or serial interconnection configuration. The function of each composite memory device 304-1 to **304-*j* is the same as previously described for the embodiments of FIG. 3A and FIG. 4**.

In memory system 300, each composite memory device is assigned a unique global device address. This unique global device address can be stored in a device address register of the bridge device 102, and more specifically in a register of the input/output interface 202 of the bridge device block diagram shown in FIG. 4. This address can be assigned automatically during a power up phase of memory system 300 using a device address assignment scheme, as described in commonly owned U.S. Patent Publication No. 20080192649 entitled "Apparatus and Method for Producing Identifiers Regardless of Mixed Device Type in a Serial Interconnection". Furthermore, each composite memory device 304 can include a discrete device register for storing information about the number of discrete memory devices in each composite memory device 304. Thus during the same power up phase of operation, the memory controller can query each discrete device register and record the number of discrete memory devices within each composite memory device. Hence the memory controller can selectively address individual discrete memory devices 104 in each composite memory device 304 of memory system 300.

A description of the operation of memory system 300 follows, using an example where composite memory device

304-3 is to be selected for executing a memory operation. In the present example, memory system 300 is a serially connected memory system similar to the system shown in FIG. 2, and each of the discrete memory devices 104 are assumed to be asynchronous NAND flash memory devices. Therefore the bridge devices 102 in each of the composite memory devices 304-1 to 304-*j* are designed for receiving global commands in a global format issued by memory controller 302, and converting them into a local format compatible with the NAND flash memory devices. It is further assumed that memory system has powered up and addresses for each composite memory device have been assigned.

The memory controller 302 issues a global command from its Sout port, which includes a global device address 116 corresponding to composite memory device 304-3. The first composite memory device 304-1 receives the global command, and its bridge device 102 compares its assigned global device address to that in the global command. Because the global device addresses mismatch, bridge device 102 for composite memory device ignores the global command and passes the global command to the input port of composite memory device 304-2. The same action occurs in composite memory device 304-2 since its assigned global device address mismatches the one in the global command. Accordingly, the global command is passed to composite memory device 304-3.

The bridge device 102 of composite memory device 304-3 determines a match between its assigned global device address and the one in the global command. Therefore, bridge device 102 of composite memory device 304-3 proceeds to convert the local memory control signals into the local format compatible with the NAND flash memory devices. The bridge device then sends the converted command to the NAND flash memory device selected by the local device address 118, which is included in the global command. The selected NAND flash device then executes the operation corresponding to the local memory control signals it has received.

While bridge device 102 of composite memory device 304-3 is converting the global command, it passes the global command to the next composite memory device. The remaining composite memory devices ignore the global command, which is eventually received at the Sin port of memory controller 302. If the global command corresponds to a read operation, the selected NAND flash memory device of composite memory device 304-3 provides read data to its corresponding bridge device 102 in the local format. Bridge device 102 then converts the read data into the global format, and passes it through its output port to the next composite memory device. The bridge devices 102 of all the remaining composite memory devices pass the read data to the Sin port of memory controller 302. Those skilled in the art should understand that other global commands may be issued for executing different operations in the NAND flash memory devices, all of which are converted by the bridge device 102 of selected composite memory device 102.

In the present embodiment, the global command is propagated to all the composite memory devices in memory system 300. According to an alternate embodiment, the bridge devices 102 include additional logic for inhibiting the global command from propagating to further composite memory devices in the memory system 300. More specifically, once the selected composite memory device determines that the global device is addressed to it, its corresponding bridge device 102 drives its output ports to a null value, such as a fixed voltage level of VSS or VDD for example. Therefore, the remaining unselected composite memory devices conserve switching power since they would not execute the global command. Details of such a power saving scheme for a serially connected memory system are described in commonly owned U.S. Patent Publication No. 20080201588 entitled "Apparatus and Method for Producing Identifiers Regardless of Mixed Device Type in a Serial Interconnection", the contents of which are incorporated by reference in their entirety.

The previously described embodiment of FIG. 5 illustrates a memory system where each composite memory device 304-1 to 304-N having the same type of discrete memory devices therein, such as for example asynchronous NAND flash memory devices. This is referred to as a homogeneous memory system because all the composite memory devices are the same. In alternate embodiments, a heterogeneous memory system is possible, where different composite memory devices have different types of discrete memory devices. For example, some composite memory devices include asynchronous NAND flash memory devices while others can include NOR flash memory devices. In such an alternate embodiment, all the composite memory devices follow the same global format, but internally, each composite memory device has its bridge device 200 designed to convert the global format memory control signals to the local format memory control signals corresponding to the NOR flash memory devices or NAND flash memory devices.

In yet other embodiments, a single composite memory device could have different types of discrete memory devices. For example, a single composite memory device could include two asynchronous NAND flash memory devices and two NOR flash memory devices. This "mixed" or "heterogeneous" composite memory device can follow the same global format described earlier, but internally, its bridge device can be designed to convert the global format memory control signals to the local format memory control signals corresponding to the NAND flash memory devices and the NOR flash memory devices.

Such a bridge device can include one dedicated format converter for each of the NAND flash memory device and the NOR flash memory device, which can be selected by previously described address information provided in the global command. As described with respect to FIG. 3B, the address header 114 includes addressing information used at the system level and the composite memory device level. This additional addressing information includes a global device address (GDA) 116 for selecting a composite memory device to execute an op-code in the memory command, and a local device address (LDA) 118 for selecting a particular discrete device within the selected composite memory device to execute the op-code. The bridge device can have a selector that uses LDA 118 to determine which of the two format converters the global command should be routed to.

The previously described embodiments of the composite memory device show how discrete memory devices responsive to memory control signals of one format can be controlled using global memory control signals having a second and different format. According to an alternate embodiment, the bridge device 200 can be designed to receive global memory control signals having one format, for providing local memory control signals having the same format to the discrete memory devices. In other words, such a composite memory device is configured to receive memory control signals that are used to control the discrete memory devices. Such a configuration allows multiple discrete memory devices to each function as a memory bank operating independently of the other discrete memory device in the composite memory device. Therefore, each discrete memory device can receive its commands from the bridge device 200, and proceed to execute operations substantially in parallel with each other. This is also referred to as concurrent operations. The design of bridge device 200 is therefore simplified, as no command conversion circuitry is required.

The previously described embodiments illustrate how discrete memory devices in a composite memory device can respond to a different command format. This is achieved through the bridge device that converts the received global command into a native command format compatible with the discrete memory devices. By example, a serial command format can be converted into an asynchronous NAND flash format. The embodiments are not limited to these two formats, as any pair of command formats can be converted from one to the other.

Regardless of the formats being used, an advantage of the composite memory device according to at least some example embodiments, is that each can be operated at a frequency to provide a data throughput that is significantly higher than that of the discrete memory devices within it. Using the composite memory device of FIG. 3A for example, if each discrete memory device 104 is a conventional asynchronous NAND flash memory device, its maximum data rate per pin is about 40 Mbps. However, the bridge device 102 which receives at least one data stream synchronously with a clock, can be configured to operate at a frequency of 166 MHz, resulting in a minimum 333 Mbps data rate per pin. Depending on the process technology being used to manufacture the bridge device 102, the operating frequency can be 200 MHz or higher to realize even higher data rates per pin. Therefore, in a larger system that uses memory system 300 of FIG. 5 to store data, high speed operations can be obtained. An example application is to use memory system 300 as a mass storage medium in a computing system or other application which demands high performance and large storage capacity.

While the data rate mismatch between the discrete memory device and the bridge device can be significant, the presently shown embodiments of bridge device 102 compensates for any level of mismatch. According to a number of example embodiments, bridge device 102 pre-fetches and stores a predetermined amount of read data from a selected discrete memory device 104 during a read operation from the corresponding composite memory device 100. The read data is transferred to the bridge device 102 at the maximum allowed data rate for the discrete memory device 104. Once the predetermined amount of read data is stored in bridge device 102, it can be outputted at its maximum data rate without restriction. For a program or write operation to composite memory device 100, bridge device 102 receives the program data at its maximum data rate and stores it. Bridge device 102 then programs the stored data in the selected discrete memory device 104 at the maximum allowed data rate for the discrete memory device 104. The maximum allowed data rate for reading data from and programming data to the discrete memory device may be standardized or outlined in its documented technical specifications.

Figure 6:
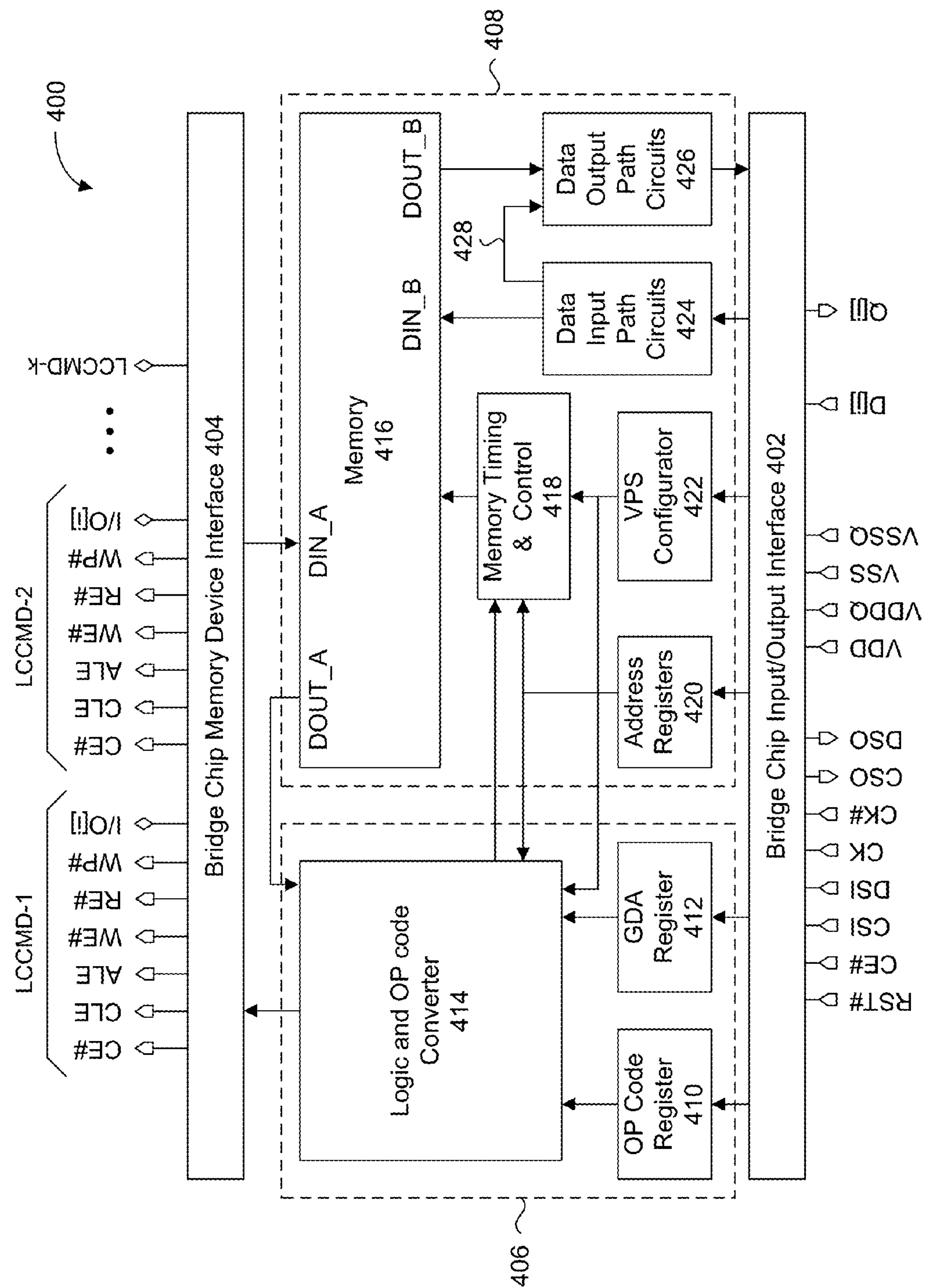
FIG. 6 is a block diagram of a NAND to a high speed serial interface bridge device, according to a present embodiment.

While FIG. 4 generally outlines the functional blocks of bridge device 200, FIG. 6 shows a more detailed block diagram of bridge device 200 in accordance with an example embodiment. Bridge device 400 includes four main functional blocks, which correspond to those shown for bridge device 200 of FIG. 4. These are the bridge device input/output interface 402, the memory device interface 404, the command format converter 406 and the data format converter 408. These blocks have functions which correspond to blocks 202, 204, 208 and 210 of FIG. 4 respectively. The embodiment of FIG. 6 is applied to an example where the composite memory device includes conventional NAND flash memory devices, and the composite memory device itself is configured to have a serial interface corresponding to the serial interface flash memory device of FIG. 2B. Following is a detailed description of the blocks 402, 404, 406 and 408.

The bridge device input/output interface 402 receives global memory control signals having one format, and passes the received global memory control signals and read data from the discrete memory devices, to subsequent composite memory devices. In the present example, these global memory control signals are the same as the identified memory control signals in FIG. 2B, which are described in Table 2. In relation to FIG. 4 using the present example, the global command GLBCMD_IN includes global memory control signals CSI, DSI and D[j] and the passed global command GLBCMD_OUT includes echo versions of the global memory control signals CSI, DSI and D[j] referred to as CSO, DSO and Q[j] respectively. The aforementioned global memory control signals CSI, DSI and D[j] are considered a global command since they are required to enable the bridge device 400 to execute operations.

The bridge device input/output interface 402 has input and output ports for receiving the signals previously outlined in Table 2. This block includes well known input buffer circuits, output buffer circuits, drivers, control logic used for controlling the input and output buffer circuits, and routing of required control signals to the command format converter 406 and routing of different types of data to and from the data format converter 408. Such types of data include, but are not limited to, address data, read data, program or write data and configuration data for example. The data received at input ports D[j] and provided at output ports Q[j] can be in either the single data rate (SDR) or double data rate (DDR) formats. Those skilled in the art should understand that SDR data is latched on each rising or falling edge of a clock signal, while DDR data is latched on both the rising and falling edges of a clock signal. Hence the input and output buffers include the appropriate SDR or DDR latching circuits. It should be noted that bridge device input/output interface 402 includes a control signal flow through path that couples the input ports receiving control signals CSI and DSI to corresponding output ports providing echo signals CSO and DSO. Similarly, a data signal flow through path couples the input ports receiving input data stream(s) D[j] to corresponding output ports providing output data stream(s) Q[j]. The output data stream(s) can be either the input data stream(s) received at D[j], or read data provided from a discrete memory device connected to bridge device 400.

In the present example, bridge device 400 receives differential clocks CK and CK# in parallel with other bridge devices in the memory system. Optionally, differential clocks CK and CK# are source synchronous clock signals that are provided from the memory controller, such as memory controller 302 of FIG. 5, and passed serially from one composite memory device to another via their respective bridge devices. In such a configuration, bridge device 400 includes a clock flow through path to couple the differential clocks CK and CK# received at input ports to corresponding output ports (not shown). Commonly owned U.S. Patent Application Publication Number 20090039927 titled "CLOCK MODE DETERMINATION IN A MEMORY SYSTEM" which is incorporated herein by reference, discloses circuits for enabling a serially connected memory device to operate with parallel or source synchronous clocks. Therefore, the techniques taught in U.S. Patent Application Publication Number 20090039927 can be equally applied to the bridge device 400.

The memory device interface 404 provides local memory control signals following a native or local format compatible with the discrete memory devices. This format may be different than the format of the global memory control signals. In the present example, memory device interface 404 has sets of local memory control signals for controlling a corresponding number of conventional NAND flash memory devices, where each set of local memory control signals includes the signals previously outlined in Table 1. In this example and with reference to FIG. 4, each set of local memory control signals provides a local command LCCMD to a corresponding NAND flash memory device in the composite memory device. Therefore, if there are k NAND flash memory devices in the composite memory device, then there are k sets of local commands LCCMD or channels. In FIG. 6 two full sets of local memory control signals are labeled as LCCMD-1 and LCCMD-2, and the last full set of local memory control signals is simply shown as an output port LCCMD-k. These local commands are provided with the proper sequence, logic states and timing that is compatible with the NAND flash memory devices, such that they will execute the operation coded in the local command.

The memory device interface 404 has output ports for providing the local memory control signals previously outlined in Table 1, and bidirectional data ports I/O[i] for providing write data and receiving read data. While not shown in FIG. 6, the memory device interface 404 receives a ready/busy signal R/B# from each NAND flash memory device. This status signal is used by logic and op-code converter block 414 to determine when any one of program, erase and read operations of the corresponding NAND flash device are completed. This block includes well known input buffer circuits, output buffer circuits, drivers and control logic used for controlling the input and output buffer circuits, and routing of data to and from the data format converter 408. Such types of data include, but are not limited to, address data, read data, and program or write data for example.

The command format converter 406 includes at least an op-code register 410, a global device address (GDA) register 412 and a Logic and Op-code Converter Block 414. The data format converter 408 includes a memory 416, a timing control circuit 418 for memory 416, address registers 420, a virtual page size (VPS) configurator circuit 422, data input path circuitry 424 and data output path circuitry 426. First is a detailed description of the command format converter 406.

The command format converter 406 receives the global memory control signals corresponding to a global command, and performs two primary functions. The first is an op-code conversion function to decode the op-codes of the global command and provide local memory control signals in a local command which represents the same operation specified by the global command. This op-code conversion function is executed by internal conversion logic (not shown). For example, if the global command is a request to read data from a particular address location, then the resulting converted local memory control signals would correspond to a read operation from a selected NAND flash memory device. The second primary function is a bridge device control function to generate internal control signals for controlling other circuits of bridge device 400, in response to the global command. This bridge device control function is provided by an internal state machine (not shown) that is pre-programmed to respond to all the valid global commands.

The GDA register 412 stores a predetermined and assigned composite memory device address, referred to as the global device address. This global device address permits a memory controller to select one composite memory device of the plurality of composite memory devices in the memory system to act on the global command that it issues. In otherwords, the two aforementioned primary functions are executed only when the composite memory device is selected. As previously discussed for FIG. 3B, the global command 110 includes a global device address field 116 for selecting a composite memory device for responding to the global memory control signals (GMCS) 112. In the present example, the global command is received as one or more serial bitstreams via data input port D[j], where the global device address is the first part of the global command 110 received by the bridge device 400. Comparison circuitry (not shown) in the Logic and Op-code Converter Block 414 compares the global device address in global device address field 116 of the global command 110 to the assigned global device address stored in GDA register 412.

If there is a mismatch between the global device address stored in GDA register 412 and global device address field 116 of the global command 110, then Logic and Op-code Converter Block 414 ignores the subsequent global memory control signals received by bridge device input/output interface 402. Otherwise, Logic and Op-code Converter Block 414 latches the op-code in the global command 110 in op-code register 410. Once latched, this op-code is decoded so that the bridge device control function is executed. For example, the latched op-code is decoded by decoding circuitry within Logic and Op-code Converter Block 414, which then controls routing circuitry within bridge device input/output interface 402 to direct subsequent bits of the global command 110 to other registers in bridge device 400. This is required since the global command 110 may include different types of data depending on the operation that is to be executed. In other words, the Logic and Op-code Converter Block 414 will know based on the decoded op-code, the structure of the global command before the bits have arrived at bridge device input/output interface 402. For example, a read operation includes block, row and column address information which is latched in respective registers. An erase operation on the other hand does not require row and column addresses, and only requires a block address. Accordingly, the corresponding op-code instructs the Logic and Op-code Converter Block 414 the time at which specific types of address data are to arrive at the bridge device input/output interface 402 so that they can be routed to their respective registers.

Once all the data of the global command 110 has been latched, then conversion circuitry generates the local memory control signals, having the required logic states, sequence and timing which would be used to execute the same operation in the NAND flash memory device. For any operation requiring access to a particular address location in the NAND flash memory devices, Logic and Op-code Converter Block 414 converts the address data stored in the address registers 420 for issuance as part of the local command through the I/O[i] ports. As will be described later, the addresses may access a virtual address space in the page buffer of the NAND flash memory device, which can change in size depending on the application. This virtual address space is related to a virtual address space in memory 416. Therefore Logic and Op-code Converter Block 414 includes configurable logic circuits for converting the addresses into addresses compatible with the NAND flash memory device, based on configuration data stored in registers of VPS configurator 422. Data to be programmed to the NAND flash memory device is provided by memory 416. The local device address (LDA) 118 field of global command 110 is used by Logic and Op-code Converter Block 414 to determine which NAND flash memory device is to receive the generated local memory control signals. Therefore, any one set of LCCMD-1 to LCCMD-k are driven with the generated memory control signals in response to a global command 110.

In the present embodiment, memory 416 is a dual port memory, where each port has a data input port and a data output port. Port A has data input port DIN_A and data output port DOUT_A, while Port B has data input port DIN_B and data output port DOUT_B. Port A is used for transferring data between memory 416 and the discrete memory devices it is coupled to. Port B on the other hand is used for transferring data between memory 416 and the D[j] and Q[j] ports of bridge device input/output interface 402. In the present embodiment, Port A is operated at a first frequency referred to as a memory clock frequency, while Port B is operated at a second frequency referred to as a system clock frequency. The memory clock frequency corresponds to the speed or data rate of the NAND flash memory device, while the system clock frequency corresponds to the speed or data rate of the bridge device input/output interface 402. Data to be programmed to the NAND flash memory device is read out via DOUT_A of memory 416 and provided to logic and op-code converter block 414, which then generates the local memory control signals compatible with the discrete memory device. Read data received from a discrete memory device is written directly to memory 416 via DIN_A under the control of logic and op-code converter block 414. Details of how Port B is used is described later. Logic and op-code converter block 414 includes control logic for controlling timing of the application and decoding of addresses, data sensing and data output and input through ports DOUT_A and DIN_A respectively, in synchronization with the memory clock frequency.

In either scenario, the global command instructs the logic and op-code converter block 414 to select a discrete memory device for which the read or write operations are to be executed on, via a set of local memory control signals (LCCMD-1 to LCCMD-k). The local device address (LDA) 118 field of global command 110 is used by logic and op-code converter block 414 to determine which NAND flash memory device is to receive the generated local memory control signals. Therefore, any one set of LCCMD-1 to LCCMD-k are driven with the generated memory control signals in response to a global command 110. The global command further instructs logic and op-code converter block 414 to execute the bridge device control function for controlling any required circuits within bridge device 400 that complement the operation. For example, data input path circuitry 424 is controlled during a write operation to load or write the data received at D[j] into memory 416, before the local memory control signals are generated.

The latched op-code can enable the op-code conversion function for generating the local memory control signals in a local command. There may be valid op-codes which do not require any NAND flash memory operations, and are thus restricted to controlling operations of bridge device 400. When a read or write operation to the NAND flash memories is requested, logic and op-code converter block 414 controls memory timing and control circuit 418, which in turn controls the timing for writing or reading data from a location in memory 416 based on addresses stored in address registers 420. Further details of these circuits now follows.

The data format converter 408 temporarily stores write data received from the bridge device input/output interface 402 to be programmed into the NAND flash memory devices, and temporarily stores read data received from the NAND flash memory devices to be output from bridge device input/output interface 402. Memory 416 is functionally shown as a single block, but can be logically or physically divided into sub-divisions such as banks, planes or arrays, where each bank, plane or array is matched to a NAND flash memory device. More specifically, each bank, plane or array is dedicated to receiving read data from a page buffer or providing write data to the page buffer, of one NAND flash memory device. Memory 416 can be any volatile memory, such as SRAM for example. Because different types of memory may have different timing and other protocol requirements, timing control circuit 418 is provided to ensure proper operation of memory 416 based on the design specifications of memory 416. For example, timing of the application and decoding of addresses, data sensing and data output and input are controlled by timing control circuit 418. The addresses, which can include row and column addresses, can be provided from address registers 420, while write data is provided via data input path circuits 424 and read data is output via data output path circuits 426. As will be discussed later, the addresses received from address registers 420 access a virtual address space in memory 416, and thus are converted by logic circuitry within timing control circuit 418 into corresponding physical addresses. This logic circuitry is configurable to adjust the conversion based on configuration data stored in registers of VPS configurator 422 because the virtual address space is adjustable in size. Further details of this feature are discussed later.

The data input path circuits 424 receives input data from input ports D[j], and because the data is received in one or more serial bitstreams switching logic is included for routing, or distributing, the bits to the various registers, such as the op-code register 410 and address registers 420. Other registers (not shown) such as data registers or other types of registers, may also receive bits of the input data once the op-code has been decoded for the selected composite memory device. Once distributed to their respective registers, data format conversion circuits (not shown) convert the data which was received in a serial format into a parallel format. Write data latched in the data registers are written to memory 416 for temporary storage under the control of timing control circuit 418, and later output to a NAND flash memory device for programming using the proper command format as determined by Logic and Op-code Converter Block 414.

After memory 416 receives read data from a NAND flash memory device from the I/O[i] ports of one set of local memory control signals, this read data is read out from memory 416 via DOUT_B and provided to output ports Q[j] via data output path circuits 426. Data output path circuits 426 includes parallel to serial conversion circuitry (not shown) for distributing the bits of data onto one or more serial output bitstreams to be output from output ports Q[j]. It is noted that data input path circuits 424 includes a data flow through path 428 for providing input data received from the D[j] input ports directly to the data output path circuits 426, for output on output ports Q[j]. Thus all global commands received at the D[j] input ports are passed through to the Q[j] output ports regardless if the embedded global device address field matches the global device address stored in the GDA register 412. In the serially connected memory system embodiment of FIG. 5, the data flow through path 428 ensures that every composite memory device 304 receives the global command issued by the memory controller 302. Furthermore, any read data provided by one composite memory device 304 can be passed through any intervening composite memory devices to the memory controller 302.

All the circuits mentioned above that are used for transferring the data between memory 416 and ports Q[j] and D[j] are operated synchronously with the system clock frequency. In particular, the timing control circuit 418 includes control logic for controlling timing of the application and decoding of addresses, data sensing and data output and input through ports DOUT_B and DIN_B respectively, in synchronization with the system clock frequency. The control logic of timing control circuit 418 is similar to the control logic within logic and op-code converter block 414 that controls operations of memory 416 at the memory clock frequency.

Prior to a description of VPS configurator circuit 422, an overview discussion of how memory 416 is used during read and write operations of the bridge device 400 follows. As previously mentioned, the bridge device input/output interface 402 may operate at a higher frequency or data rate to provide or receive more data in a given period of time than is possible by any of the discrete memory devices in the composite memory device. With data format converter 408, memory 416 is used to temporarily store data received at one clock frequency via one of interfaces 402 and 404, so that the stored data can be provided at a different frequency via the other of interfaces 402 and 404. The memory 416 is large enough to store a predetermined amount of data to ensure that i) the higher speed interface sustains its constant data output rate, or ii) the higher speed interface sustains its constant data input rate.

Using the example where a discrete memory device is a NAND flash memory device, those skilled in the art understand that the NAND flash memory device has a page buffer for storing a page of read data or write data, where a page is well understood to be the data stored in the memory cells activated by a single logical wordline. For example, the page buffer can be 2K, 4K or 8K bytes in size depending on the memory array architecture. During a read operation where one row is activated, one page of data corresponding to the memory cells of the row are accessed, sensed and stored in the page register. This is referred to as a core read time, Tr. If the NAND flash memory device has an I/O width of i=8 bits for example, then the contents of the page register are output 8 bits at a time at its maximum rate, to bridge device 400. Bridge device 400 then writes the data to memory 416. Once the contents of the page buffer are stored in memory 416, all or portion, of the page buffer data stored in memory 416 can be output onto the data output ports Q[j] via the data output path circuits 426 at the higher data rate. In a write operation, data received from input ports D[j] is written to memory 416 the maximum data rate of interface 402. Then all or a portion of the data is read out from memory 416 and provided to a selected NAND flash memory device 8 bits at a time, at the slower data rate native to the NAND flash memory device. The NAND flash memory device stores the data in its page register, and subsequently executes internal programming operations to program the page of data in the page buffer into a selected row. This is referred to as a core program time, Tpgm, which may include program verification steps to validate the correct programmed states of the memory cells, and any necessary subsequent program iterations to re-program any bits that did not program properly from a previous program iteration.

Figure 7:
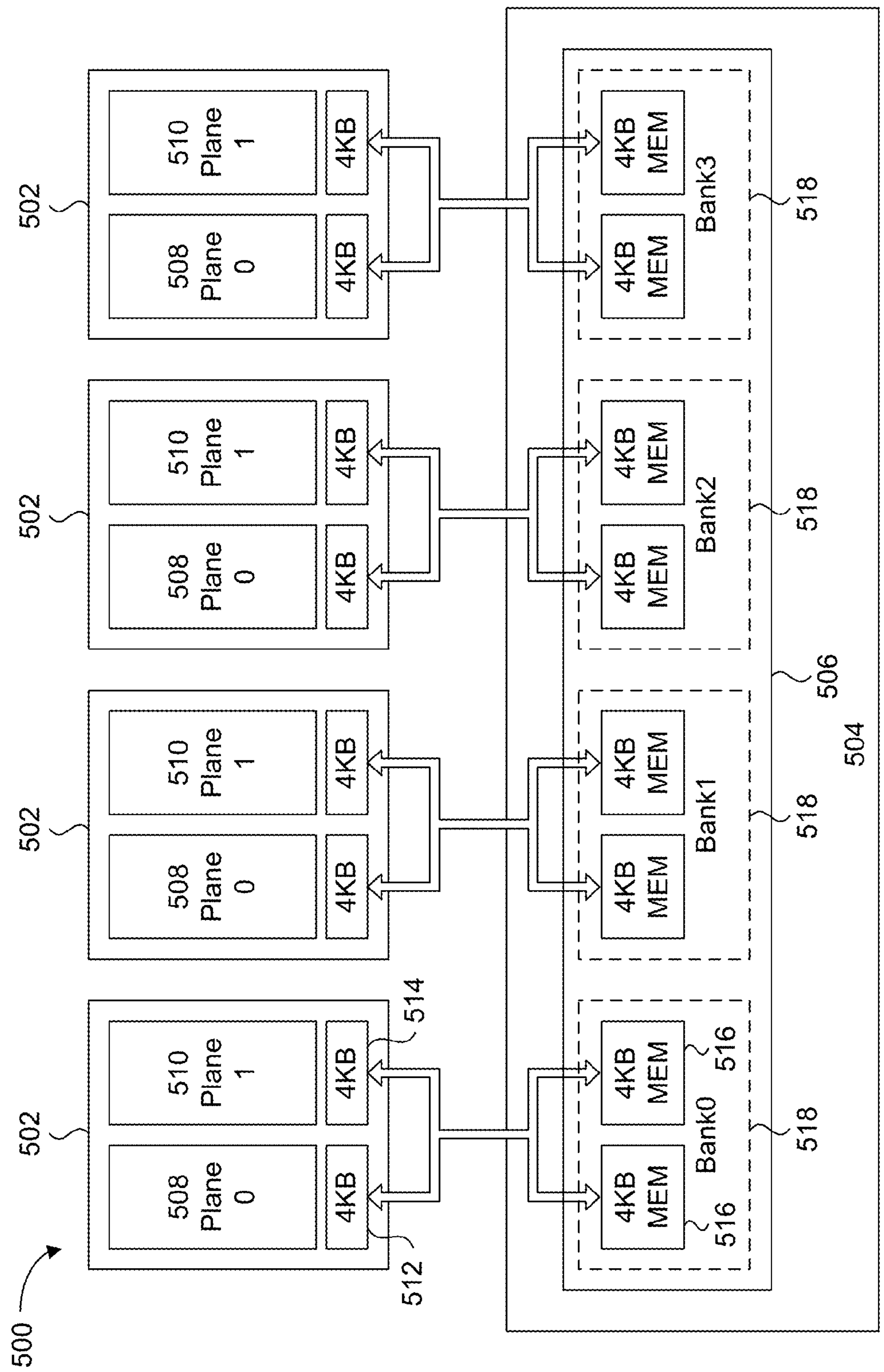
FIG. 7 is a block diagram showing memory mapping of the bridge device of FIG. 6 to NAND flash memory devices, according to a present embodiment.

FIG. 7 is a block diagram of a composite memory device 500 illustrating the relationship between page buffers of four NAND flash memory devices and the memory of a bridge device. Composite memory device 500 is similar to composite memory device 100 shown in FIG. 3A, and includes four NAND flash memory devices 502 in the example embodiment of FIG. 7, and a bridge device 504. Bridge device is shown as a simplified version of bridge device 400 of FIG. 6, where only the memory 506 is shown. The other components of bridge device 400 are omitted from FIG. 7, but should be understood to be present in order to ensure proper operation of bridge device 500. As will be discussed later, memory 506 is logically organized into groups that correspond with the page buffer of each of the four NAND flash memory device 502.

Each NAND flash memory device 502 has a memory array organized as two planes 508 and 510, labeled "Plane 0" and "Plane 1" respectively. While not shown, row circuits drive wordlines that extend horizontally through each of planes 508 and 510, and page buffers 512 and 514 which may include column access and sense circuits, are connected to bitlines that extend vertically through each of planes 508 and 510. The purpose and function of these circuits are well known to those skilled in the art. For any read or write operation, one logical wordline is driven across both planes 508 and 510, meaning that one row address drives the same physical wordline in both planes 508 and 510. In a read operation, the data stored in the memory cells connected to the selected logical wordline are sensed and stored in page buffers 512 and 514. Similarly, write data is stored in page buffers 512 and 514 for programming to the memory cells connected to the selected logical wordline.

Memory 506 of bridge device 504 is divided into logical or physical sub-memories 516 each having at least the same storage capacity of a page buffer 512 or 514. A logical sub-memory can be an allocated address space in a physical block of memory while a physical sub-memory is a distinctly formed memory having a fixed address space. The sub-memories 516 are grouped into memory banks 518, labeled Bank0 to Bank3, where the sub-memories 516 of a memory bank 518 are associated with only the page buffers of one NAND flash memory device 502. In otherwords, sub-memories 516 of a memory bank 518 are dedicated to respective page buffers 512 and 514 of one NAND flash memory device 502. During a read operation, read data in page buffers 512 and 514 are transferred to sub-memories 516 of the corresponding memory bank 518. During a program operation, write data stored in sub-memories 516 of a memory bank 518 is transferred to the page buffers 512 and 514 of a corresponding NAND flash memory device 502. It is noted that NAND flash memory device 502 can have a single plane, or more than two planes, each with corresponding page buffers. Therefore, memory 506 would be correspondingly organized to have sub-memories dedicated to each page buffer.

The present example of FIG. 7 has NAND flash devices 502 with at total of 8 KB of page buffer space, organized as two separate 4 KB page buffers. Each separate 4 KB page buffer is coupled to the bitlines of a respective plane, such as plane 508 or plane 510 for example. Those skilled in the art understand that page buffer sizes have gradually increased as the overall capacity of NAND flash memory devices has increased, thus future NAND flash devices may have even larger page buffers. The larger page buffers allow for faster overall read and program operations because the core read and program times of the NAND flash memory device is substantially constant, and independent of the page buffer size which is well known to persons skilled in the art. When compared to a page buffer of half the size, a larger page buffer enables a relatively constant burst read of twice as much read data before another core read operation is needed to access another page of data stored in a different row of the memory array. Similarly, twice as much write data can be programmed to the memory array at the same time before another page of write data needs to be loaded into the page buffer. Therefore, larger page buffers are suited for multimedia applications where music or video data can be several pages in size.

In the composite memory device 500 of FIG. 7, the total core read time includes the NAND flash memory device core read time, earlier referred to as Tr, plus a transfer time Ttr. The transfer time Ttr is the time required for the NAND flash memory device to output, or read out, the contents of the page buffers 512 and 514 so that they can be written to corresponding sub-memories 516 of one memory bank 518. The total core program time includes a program transfer time Ttp plus the NAND flash memory device core program time earlier referred to as Tpgm. The program transfer time Ttp is the time required for the bridge device 508 to output, or read out, the contents of sub-memories 516 of one memory bank 518 so that they can be loaded into corresponding page buffers 512 and 514 of a NAND flash memory device 502 prior to a programming operation. For multimedia applications, the data can be stored across different NAND flash memory devices and concurrently operated to mask core operations of one NAND flash memory device while data corresponding to another NAND flash memory device 502 is being output by bridge device 504. For example, during burst read out of data from one memory bank 518, a core read operation may already be in progress for loading the sub-memories 516 of another memory bank 518 with data from another NAND flash memory device 502.

There may be applications where the file sizes are smaller than a full page size of a NAND flash memory device page buffer. Such files include text files and other similar types of data files that are commonly used in personal computer desktop applications. Users typically copy such files to Universal Serial Bus (USB) non-volatile storage drives which commonly use NAND flash memory. Another emerging application are solid state drives (SSD) which can replace magnetic hard disk drives (HDD), but use NAND flash memory or other non-volatile memory to store data. The composite memory device read and program sequence is the same as previously described, with the following differences. This example assumes that the desired data is less than a full page size, and is stored in a page with other data. For a read operation, after all the page buffer data has been transferred from page buffers 512 and 514 of a selected NAND flash memory device 502 to corresponding sub-memories 516, a column address is used to define the locations of the first and last bit positions of the desired data stored in sub-memories 516 of the memory bank 518. Then only the first, last and the intervening bits of data are read out from sub-memories 516 of bridge device 504.

The transfer time Ttr in such scenarios may not be acceptable for certain applications due to its significant contribution to the total core read time of the composite memory device. Such applications include SSD where read operations should be performed as fast as possible. While the core read time Tr for NAND flash memory devices remains constant for any page buffer size, the transfer time Ttr for transferring the entire contents to the sub-memories 516 is directly dependent on the page buffer size.

According to a present embodiment, the transfer time Ttr of the composite memory device can be minimized by configuring the sub-memories 516 of a memory bank 518 to have a virtual maximum page size, referred to as a virtual page size, that is less than the maximum physical size of the page buffer of a NAND flash memory device within the composite memory device. Based on the virtual page size configuration for a particular memory bank 518, the bridge device 504 issues read commands where only a segment of data corresponding to the virtual page size stored in the page buffer is transferred to the corresponding sub-memories 516. This segment of the page buffer is referred to as a page segment.

Figure 8A:
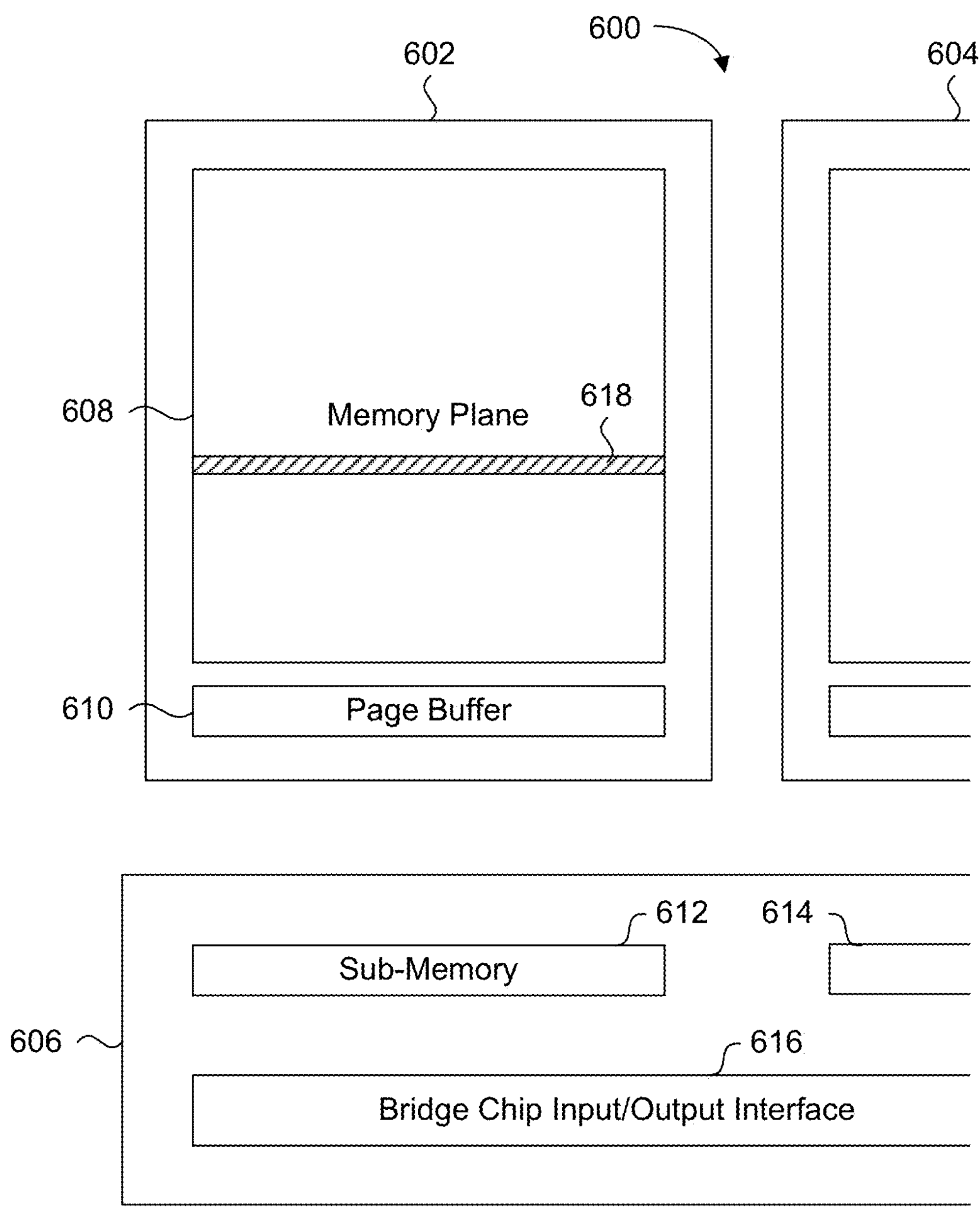
FIGS. 8A, 8B and 8C illustrate an example read operation from one NAND flash memory device using the bridge device of FIG. 6.
Figure 8B:
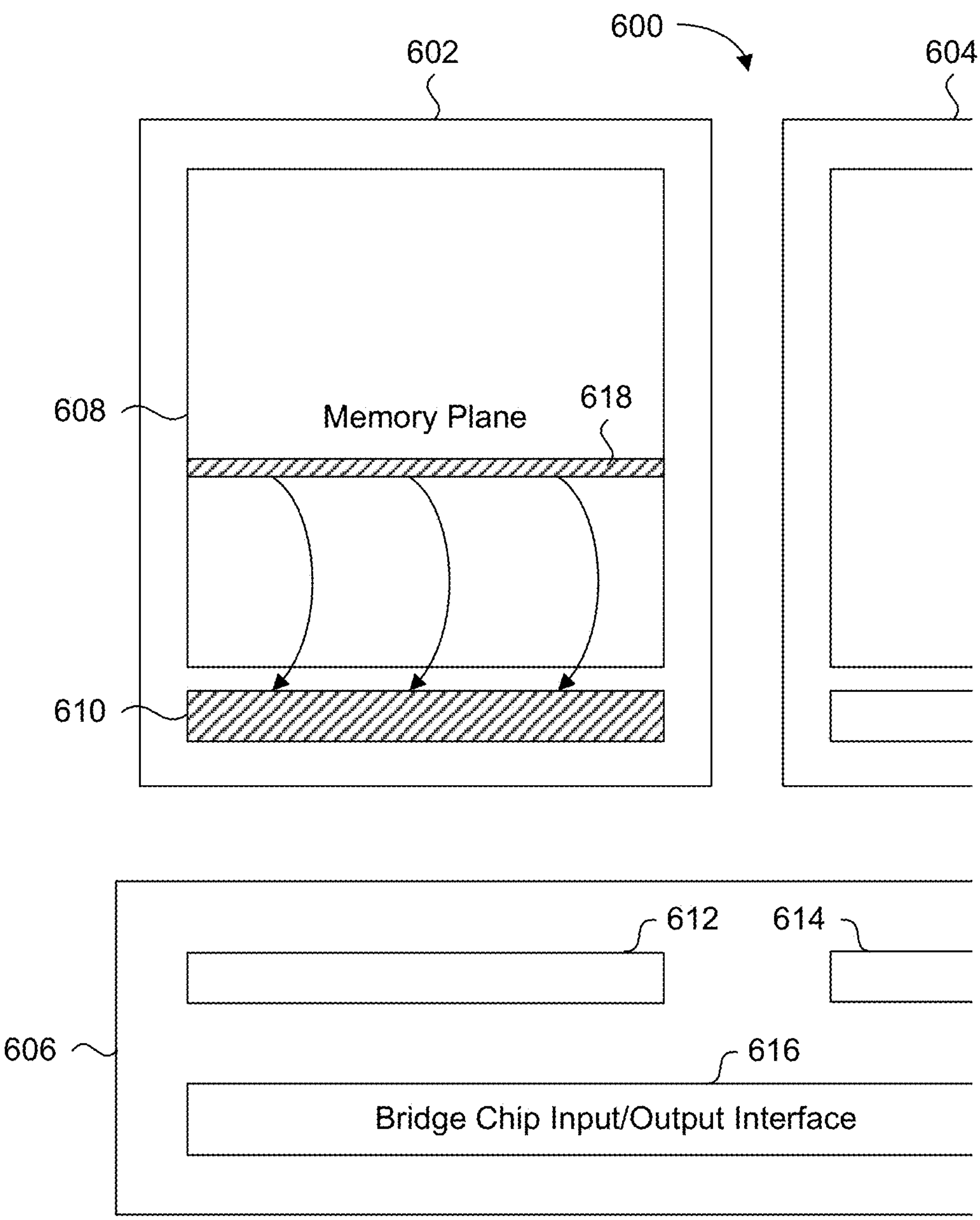
Figure 8C:
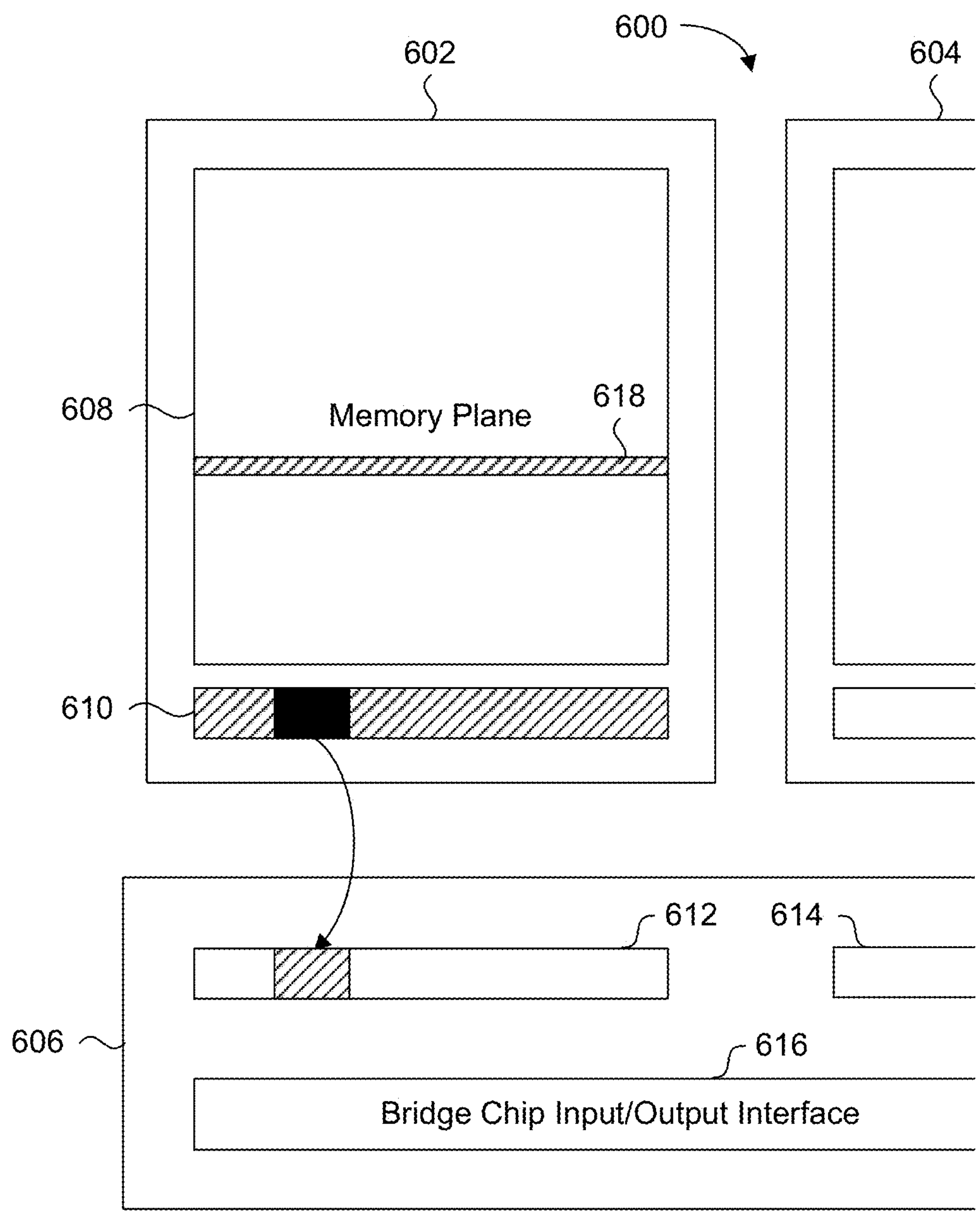

FIGS. 8A to 8C illustrates how data corresponding to a set virtual page size is read from a discrete memory device, such as a flash memory device, is read out of a composite memory device, according to a present embodiment. FIGS. 8A to 8C shows a composite memory device 600 having one fully shown first NAND flash memory device 602, a portion of a second NAND flash memory device 604, and a portion of bridge device 606. The NAND flash memory devices of this example have a single plane 608 having bitlines connected to a single page buffer 610. The shown portion of bridge device 606 includes a first sub-memory 612, a second sub-memory 614, and a bridge device input/output interface 616. First sub-memory 612 corresponds to a first bank, which is associated with first NAND flash memory device 602 while second sub-memory 614 corresponds to a second bank, which is associated with second NAND flash memory device 604. For the purpose of explaining a read operation in the present example, it is assumed that data from first NAND flash memory device 602 is to be accessed, and the virtual page size of the first bank (first sub-memory 612) has been configured to be smaller than the maximum physical size of page buffer 610.

Starting in FIG. 8A, it is assumed that bridge device 606 has received global memory control signals representing a read operation to access data stored in first NAND flash memory device 602, and has encoded and provided the appropriate local memory control signals to first NAND flash memory device 602. In response to the local memory control signals corresponding to a read command, first NAND flash memory device 602 activates a row or wordline 618 selected by address information in the local memory control signals. Proceeding to FIG. 8B, when the wordline 618 is activated, or driven to a voltage level effective for accessing the stored data of the memory cells connected to it, a current or voltage generated on the bitlines connected to each accessed memory cell is sensed by sense circuitry within page buffer 610. Thus the data states of the accessed memory cells are stored in page buffer 610. In FIG. 8C, NAND flash memory device 602 outputs data stored within a specific range of bit positions of page buffer 610 to bridge device 606, and in particular to first sub-memory 612. This data output process is executed at up to the maximum rated speed or data rate for NAND flash memory device 602.

In this example NAND flash memory device 602, a burst read command including column addresses corresponding to this specific range of bit positions is provided by bridge device 606 automatically once NAND flash memory device 602 reports or signals to bridge device 606 that the read data from the selected row 618 is stored in page buffer 610, usually by way of a ready/busy signal. The column addresses are determined based on the configured virtual page size for first sub-memory 612. The data stored in first sub-memory 612 is then output through the output data ports of composite memory device 600 via bridge device input/output interface 616 at the higher speed or data rate.

Therefore it can be seen that by setting a virtual page size for first sub-memory 612 to be less than the maximum physical size of page buffer 610, only a correspondingly sized page segment of data from page buffer 610 is output to first sub-memory 612. This page segment includes the specific range of bit positions, each of which are addressable by a column address. As will be discussed later, the page segment is addressable. Accordingly the transfer time Ttr for the NAND flash memory device 602 to output this page segment of data from page buffer 610 can be significantly reduced relative to the situation where all the data of page buffer 610 is transferred to first sub-memory 612.

The above mentioned example illustrates how the transfer time Ttr can be minimized. Setting the virtual page size to be less than the maximum physical size of page buffer 610 provides the same performance advantage during write operations. In a write operation, the sequence shown in FIGS. 8A to 8C is effectively reversed. For example, write data is received by bridge device input/output interface 616 and written to a sub-memory such as first sub-memory 612. This write data has a size matching the preset virtual page size, which is then transferred to page buffer 610. The time required for transferring this write data from the bridge device 606 to the page buffer 610 is the transfer time Ttr, which depends on the size of the write data and the operating frequency of the NAND flash device 602. The write data is stored within specific bit positions of page buffer 610, called a page segment, and the core programming operation of NAND flash device 602 is initiated through activation of a selected row 618 and the application of the required programming voltages to the bitlines in response to the write data stored in page buffer 610. Therefore, by shortening the transfer time Ttr during a write operation, the overall write time of the memory system is reduced.

Figure 9A:
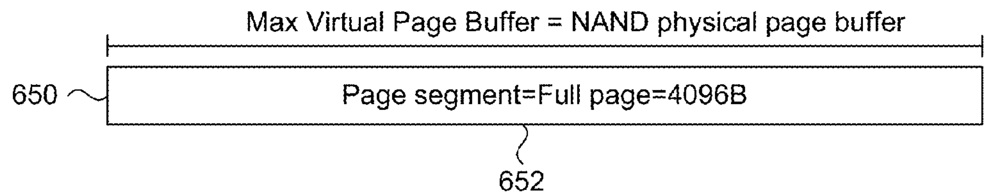
FIGS. 9A, 9B, 9C and 9D illustrate example virtual page configurations for each memory bank of the bridge device of FIG. 6.
Figure 9B:
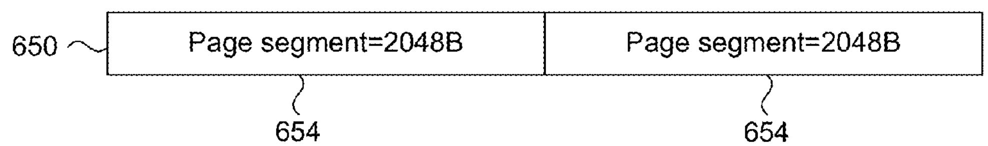
Figure 9C:
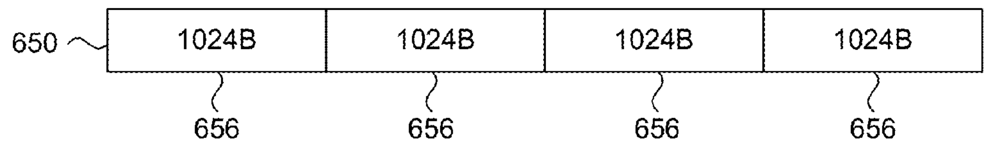
Figure 9D:
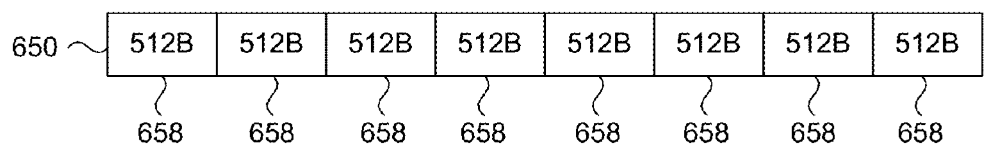

According to the present embodiments, first sub-memory 612 of the bridge device 606 can be dynamically configured to have any one of preset virtual page sizes. Once the virtual page size of first sub-memory 612 is configured, then the page buffer 610 of the corresponding NAND flash memory device is logically subdivided into equal sized page segments corresponding to the configured virtual page size. FIGS. 9A to 9D are schematic representations of a NAND flash memory device page buffer 650 with differently sized page segments based on a configured virtual page size. It is noted that the page segments represent a virtual address space in page buffer 650. In the present examples of FIGS. 9A to D, the NAND flash page buffer, and the sub-memory of the bridge device, both have a maximum 4K physical size. In FIG. 9A, the virtual page size (VPS) is set to the maximum, or full 4K size such that there is only one page segment 652. In FIG. 9B, the VPS is set to 2K, resulting in two 2K page segments 654. In FIG. 9C, the VPS is set to 1K, resulting in four 1K page segments 656. In FIG. 9D, the VPS is set to 512 bytes (B), resulting in eight page segments 512 B in size. Those skilled in the art will understand that even smaller sized VPS and corresponding page segments are possible, and that the total number of page segments depends on the maximum size of the NAND flash memory device page buffer 650.

As previously discussed for the present embodiments, after the page buffer 650 of the NAND flash memory device has been loaded with data for a read operation, only page segment of the page buffer 650 is output to the bridge device. The desired data may be stored in one particular page segment of page buffer 650. Therefore each page segment is addressable by a virtual page address provided in the global command to the bridge device. For example, two address bits are used to select one of four page segments 656 in FIG. 9C. Once selected, the desired data may not occupy all bit positions in the selected page segment of page buffer 650. Thus a virtual column address is used to select the first bit position within the selected page segment where read data is to be read out, typically in a burst read operation. Table 3 below summarizes example addressing schemes based on the example page segments shown in FIGS. 9A to 9D.

TABLE 3

| Virtual Page Size Configuration | # of Page Segments | Bits for addressing Page Segments (VPA) | Bits for addressing bit position in each Page Segment (VCA) |
|---|---|---|---|
| 4096 B | 1 | N/A | 12 |
| 2048 B | 2 | 1 | 11 |
| 1024 B | 4 | 2 | 10 |
| 512 B | 8 | 3 | 9 |

Example addressing schemes are shown in Table 3 by example, but those skilled in the art should understand that different addressing schemes can be used depending on the size of the page buffer of the NAND flash memory device. As shown in Table 3, each addressing scheme includes a first number of bits for addressing two or more page segments, and a second number of bits for addressing a column in the selected page segment. The first number of bits is referred to as a virtual page address (VPA) and the second number of bits is referred to as a virtual column address (VCA). The virtual page address and the virtual column address are collectively referred to simply as a virtual address. In the present embodiments, the VPS configuration of each sub-memory or bank of sub-memories is known to the memory controller or other host system that requests read data and provides write data to the composite memory device. Therefore a virtual address for reading a page segment from the page buffer of the NAND flash memory device is provided in the global command to the composite memory device with a corresponding addressing scheme for accessing a particular NAND flash memory device therein. The possible addressing schemes, including those shown in Table 3, address a virtual or logical address space of the page buffer. While this logical address space has been described as bit positions of page segments in page buffers 650 of FIGS. 9A to 9D, the actual page buffers are addressed with real physical addresses.

Because the virtual address can follow one of several different addressing schemes, the conversion circuitry in logic and op-code converter block 414 of FIG. 6, and address decoding circuits in timing control circuit 418 are configurable to ensure that proper corresponding physical addresses are generated for accessing data both in the page buffer of the NAND flash memory device and the sub-memory. This is due to the fact that statically set conversion logic is designed for a fixed address range and has inputs “hard-wired” to receive specific address bits. Since the addressing scheme is directly related to the selected virtual page size, a VPS configuration code is used to dynamically set the address conversion circuitry that translates or converts, the virtual address into physical addresses. Persons of skill in the art should understand that adjustable logic functions and decoding circuits are known in the art.

According to a present embodiment, the virtual address is primarily used for selecting data from the selected page segment of the NAND flash page buffer to be read out. For a read operation, this virtual address is latched so that accesses to the page buffer and the corresponding sub-memory of a bank relating to this read operation are based on this virtual address. This simplifies control over the composite memory device since only one set of address information is provided for the read operation. With reference to FIG. 6, Logic and Op-code Converter Block 414 uses the VPS configuration code to convert the virtual address into corresponding address signals for the NAND flash memory device. This same virtual address is translated by conversion logic configured by the VPS configuration code within timing control circuit 418, to generate the write address of the sub-memory to which the data from the page buffer is to be stored within. The same conversion logic or similar conversion logic converts the virtual address into a read address to read out the data stored from the previous write operation, which is output from the composite memory device.

With reference to FIG. 7, each memory bank 518 of memory 506 is independently configurable to have its own virtual page size. In order to configure the memory banks 518 of the bridge device, a global virtual page size configuration command is provided to the composite memory device. This is can be provided just after power up of the system that includes the composite memory device. With reference to the bridge device 400 of FIG. 6, the VPS configuration command is received at the D[j] input port, and includes VPS configuration code for at least one sub-memory bank, an op-code, and a global device address GDA. As previously discussed, the GDA is used to select the specific composite memory device that is to act on, or execute, the command. The op-code is decoded by logic within Logic and Op-code Converter Block 414, and the subsequently received virtual page size configuration data is routed by control circuitry within bridge device 400 to corresponding virtual page registers within VPS Configurator 422.

Figure 10:
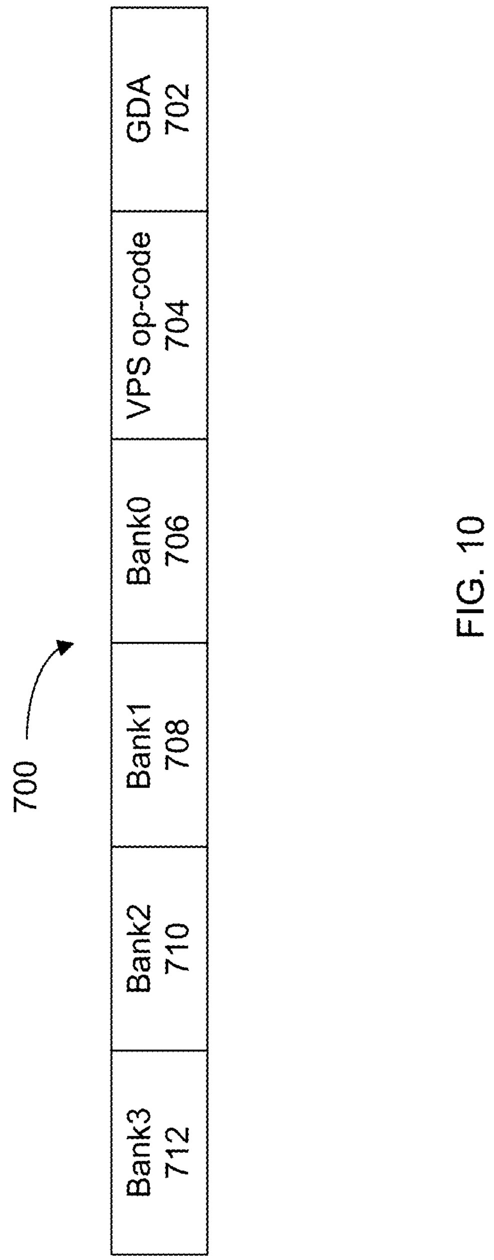
FIG. 10 is an illustration of a VPS configuration command, according to a present embodiment.

FIG. 10 is a schematic illustrating the hierarchy of a VPS configuration command, according to a present embodiment. Starting from the right side of FIG. 10, the structure of VPS configuration command 700 includes the previously described GDA field 702, an op-code field 704, and in the present example, four VPS data fields 706, 708, 710 and 712. The GDA field 702 and the op-code field 704 can be referred to as a header that precedes the data payload which includes up to the four VPS data fields 706, 708, 710 and 712. With reference to FIG. 7, the positions of the four VPS data fields corresponds to a specific memory bank 518 of memory 506. In the present example of FIG. 10 applied to memory 506 of FIG. 7, VPS data field 706 corresponds to Bank0, VPS data field 708 corresponds to Bank1, VPS data field 710 corresponds to Bank2, and VPS data field 712 corresponds to Bank3. The presented right to left ordering of the fields of VPS configuration command 700 represents the order they are provided to bridge device 504. The number of VPS data fields of VPS configuration command 700 is directly scaled with the number of memory banks 518 of memory 506. For example, if memory 506 is designed to include eight memory banks 518, then VPS configuration command 700 can include up to a maximum of eight corresponding VPS data fields.

According to a present embodiment, the memory banks 518 of memory 506 are ordered from a least significant bank to a most significant bank. Therefore in the example of FIG. 7, Bank0 is the least significant bank while Bank3 is the most significant bank. As will be described later, the VPS configuration command 700 has VPS data field structure that follows the ordering of Bank0 to Bank3 to simplify circuitry and logic for configuring memory banks 518. Thus the first VPS data field 706 adjacent the op-code field is the least significant VPS data field while VPS data field 712 is the most significant VPS data field. With this ordering scheme, the VPS configuration command 700 can be dynamically sized depending on the highest significant memory bank 518 that is to be configured. More specifically, only the VPS data fields corresponding to the highest significant memory bank 518 to be configured and all the lower significant banks, are included in VPS configuration command 700. This is illustrated in more detail in FIGS. 11A and 11B.

Figure 11A:
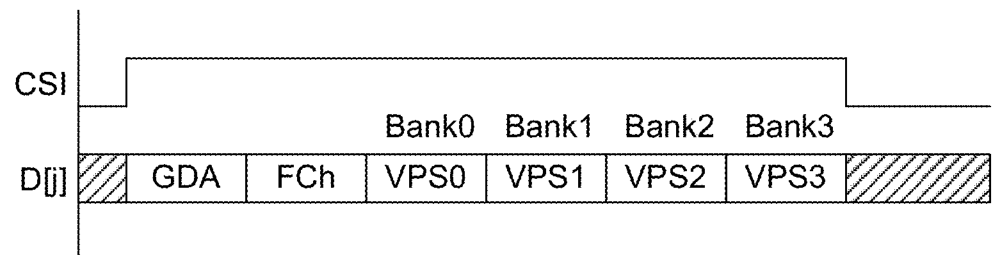
FIGS. 11A and 11B are timing diagrams of dynamically sized configuration commands, according to a present embodiment.
Figure 11B:
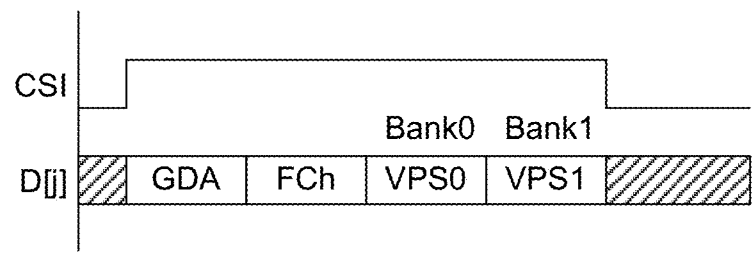

FIGS. 11A and 11B are sequence diagrams showing examples of how the VPS configuration command 700 of FIG. 10 is provided, based on the highest significant memory bank 518 that is to be configured. Both sequence diagrams show signal traces for signals CSI and D[j] both of which have been previously described in Table 2. Using memory 506 of FIG. 7 by example, it is assumed in FIG. 11A that Bank3 is to be configured. A GDA field 702 is first received by bridge device 504 and it is assumed that the address in the GDA field 702 is a match to the stored device address in the current bridge device 504. Following in op-code field 704 is a hexadecimal code FCh, corresponding to a virtual page size configuration command. Because the highest significant bank to be configured is Bank3, all four VPS data fields are provided to bridge device 504 and latched therein. In the present embodiment, the VPS data fields for Bank0, Bank 1 and Bank2 include VPS configuration code VPS0, VPS1, VPS2 and VPS3, but it will be the same data that has been previously latched so that their VPS configuration remains unchanged. In otherwords, the corresponding registers are overwritten with the previous VPS configuration code. In an alternate embodiment, the VPS data fields for Bank0, Bank1 and Bank2 include a null value that is decoded such that the overwriting operation is inhibited and the previously latched VPS configuration code for these banks remain unchanged. In an extension of the example of FIG. 11A, one or more of Bank0, Bank1 and Bank2 can be configured along with Bank3 by including the new VPS configuration code in their respective VPS data fields. Therefore, when a highest significant memory bank 518 is to be configured, the remaining lower significant banks can be optionally configured.

FIG. 11A illustrates an example where the VPS configuration command 700 is at its maximum size. FIG. 11B illustrates an example where the VPS configuration command is shortened. In FIG. 11B, it is assumed that Bank1 is to be configured. Because the highest significant bank to be configured is Bank1, the VPS data fields for Bank2 and Bank3 are omitted. The VPS data field for Bank0 is included, which as previously mentioned can include new VPS configuration code, the previously latched VPS configuration code, or a null value. In both FIGS. 11A and 11B, the CSI strobe signal is driven to VSS to signal the bridge device that no further command information appearing on the D[j] input port is valid. As shown in FIGS. 11A and 11B, the high logic level duration of the CSI strobe signal corresponds to the size of the VPS configuration command, and more specifically, for the number of clock cycles required to latch all bits of the VPS configuration command.

With the previously described structure of VPS configuration command 700, the logic and latching circuitry for VPS configurator 422 first shown in FIG. 6 is simplified relative to a VPS command structure in which VPS configuration code is randomly provided for just the banks that are to be configured.

In both the examples of FIGS. 11A and 11B, a memory controller or other controlling circuit responsible for issuing commands to the composite memory devices and for receiving read data from the composite memory devices sets the VPS configuration command 700. The memory controller first identifies the highest significant memory bank to be configured, and then issues the command having a data payload which is limited to including the first VPS configuration code corresponding to the least significant memory bank up to the last VPS configuration code corresponding to the identified highest significant memory bank being configured. The other VPS configuration code between the first and the last VPS configuration code is referred to as intermediate VPS configuration code.

Figure 12A:
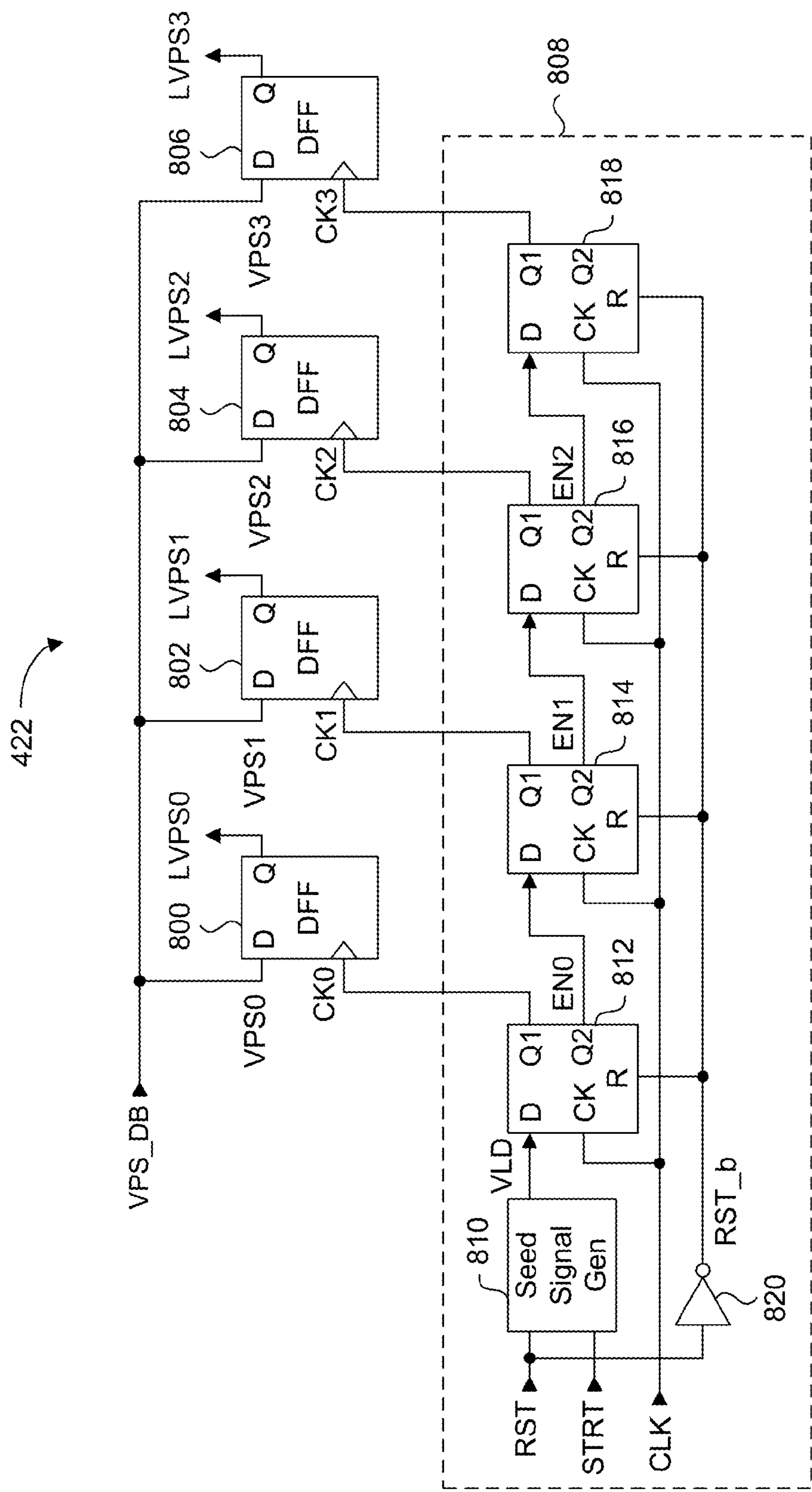
FIG. 12A is an example embodiment of the VPS configurator of FIG. 6, according to a present embodiment.

FIG. 12A is a circuit schematic of VPS configurator 422 according to a present embodiment. VPS configurator 422 includes domino latching circuitry for storing data corresponding to the VPS configuration code of the VPS configuration command 700. More specifically, VPS configurator 422 includes registers 800, 802, 804 and 806, and domino activation logic 808 for enabling each of the registers 800, 802, 804 and 806 in sequence based on a clock signal CLK. In the presently shown embodiment, register 800 represents a group of registers, where each register of the group is dedicated for receiving, storing and providing one bit of the VPS configuration code VPS0. Registers 802, 804 and 806 are similarly configured. Hence each register can be any number of bits in size, to match the size of the VPS configuration code. The present example includes four registers 800, 802, 804 and 806, but any number of registers can be included to match the number of memory banks 518 of memory 506 of FIG. 7. The domino activation logic 808 includes a seed signal generator 810 and four latch signal generators 812, 814, 816 and 818 arranged in series with each other.

Registers 800, 802, 804 and 806 are shown in the present example as well known D-type flip-flop circuits. Each of registers 800, 802, 804 and 806 has a D input for receiving a VPS configuration code, a Q output for providing the latched VPS configuration code, and a clock input for enabling receipt and latching of the VPS configuration code received at its D input. In the present embodiment, the VPS configuration codes provided in the VPS data fields of VPS configuration command 700 of FIG. 10 are time multiplexed onto a common bus that is connected to all the D inputs of registers 800, 802, 804 and 806. This common bus is the VPS data bus VPS_DB. In one example implementation of the present embodiment, all data bits corresponding to one VPS configuration code is asserted onto VPS_DB each clock cycle. Therefore in the presently shown example, four different VPS configuration codes are asserted onto VPS_DB in four consecutive clock cycles. Therefore, each register 800, 802, 804 and 806 is activated to latch the data appearing on VPS_DB by the domino activation logic 808 at the appropriate time. Thus, registers 800, 802, 804 and 806 outputs latched VPS configuration codes LVPS0, LVPS1, LVPS2 and LVPS3 respectively.

The domino activation logic 808 generates clock pulses CK0, CK1, CK2 and CK3 in response to each active edge of the clock signal CLK after the circuit is initiated. In the aforementioned example implementation where a VPS configuration code is asserted onto VPS_DB each clock cycle, clock pulses CK0, CK1, CK2 and CK3 are generated once each clock cycle. The domino activation logic 808 is initiated by seed signal generator 810 that generates a starting signal in response to pulsed control signal STRT. Each of the latch signal generators 812, 814, 816 and 818 has a data input port D, a clock input port CK, a reset port R, and output ports Q1 and Q2. Following is a description of the operation of any one of the latch signal generators 812, 814, 816 and 818. A high logic level (ie. logic "1" state) at data input port D is latched on the rising edge of a clock signal received at clock input port CK, which results in the generation of a high logic level pulse from output port Q1. The duration of the high logic level pulse from Q1 is sufficiently long to enable a corresponding register 800, 802, 804 or 806 to latch the data appearing on its D input. Output port Q2 provides a high logic level signal in response to the high logic level signal at data input port D, which functions as an enable signal for the next latch signal generator. These enable signals are labeled EN0, EN1 and EN2 from latch signal generators 812, 814 and 816 respectively. The last latch signal generator 818 does not need to provide an enable signal from its Q2 output because there are no further latch signal generators to enable in the chain. In the embodiment of FIG. 12A, the reset signal RST is inverted by inverter 820 to produce RST_b, which is provided to all latch signal generators 812, 814, 816 and 818. When RST is at the high logic level, the Q1 and Q2 outputs of all latch signal generators 812, 814, 816 and 818 fall to the low logic level.

Figure 12B:
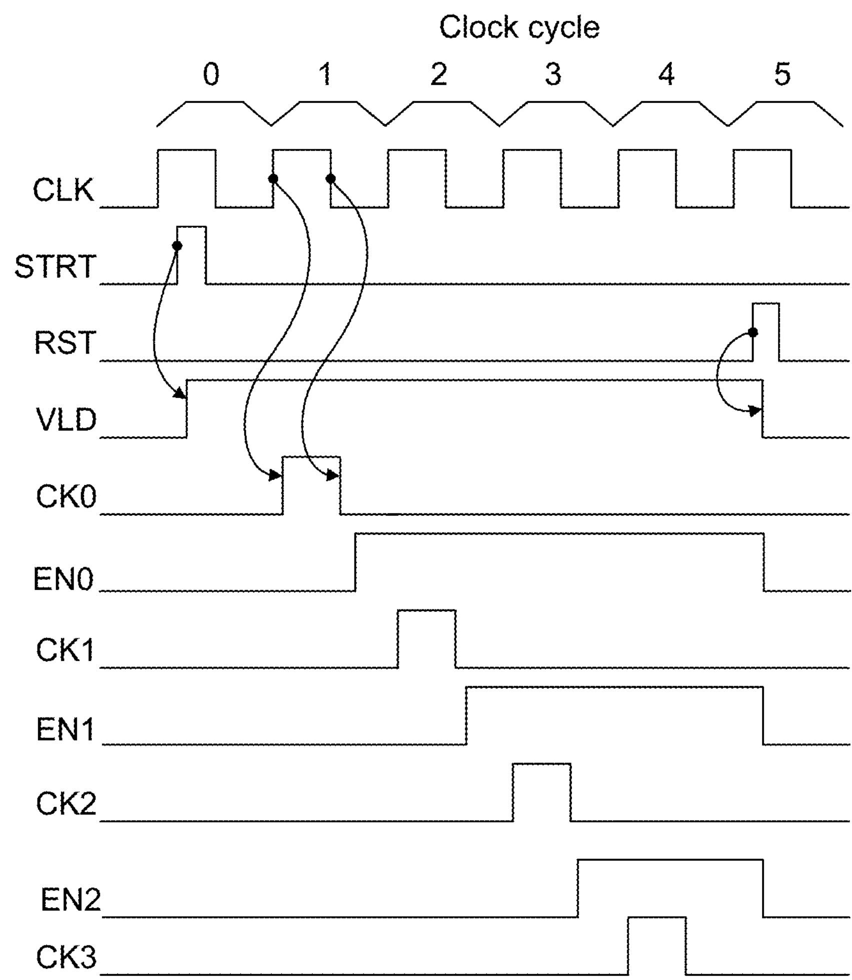
FIG. 12B is a sequence diagram illustrating the operation of the VPS configurator of FIG. 12A.

The operation of virtual page size configurator circuit 422 now follows with reference to the sequence diagram of FIG. 12B. It is assumed that a VPS configuration command, such as VPS configuration command 700 of FIG. 10, is received by the bridge device, and that VPS configuration code VPS0, VPS1, VPS2 and VPS3 are provided in sequence to the bridge device in the format shown in FIG. 11A. FIG. 12B shows signal traces for the signals CLK, STRT, RST, VLD, CK0, CK1, CK2, CK3, EN0, EN1 and EN2. Starting at clock cycle 0, STRT is pulsed to the high logic level, which results in seed signal generator 810 driving VLD to the high logic level. With VLD at the high logic level, latch signal generator 812 drives CK0 to the high logic level at the rising edge of CLK at clock cycle 1. On the falling edge of CLK following the first rising edge, CK0 is driven back to the low logic level. During the high logic level pulse of CK0, register 800 is clocked to latch VPS0 which was asserted on VPS_DB during clock cycle 1. Just after CK0 is driven back to the low logic level, enable signal EN0 is driven to the high logic level by latch signal generator 812. Thus in the present embodiment, CK0 has a pulse duration corresponding substantially to the duration of the high logic level of CLK. Because CLK is at the low logic level in clock cycle 1, subsequent latch signal generator 814 remains inactive while EN0 is at the high logic level. However, at the beginning of clock cycle 2, latch signal generator 814 latches the high logic level of EN0 on the rising edge of CLK to drive CK1 to the high logic level. Corresponding register 802 then latches VPS1 which has been asserted on VPS_DB during clock cycle 2. CK1 is eventually driven back to the low logic level, followed by EN1 being driven to the high logic level. As can be seen in FIG. 12, latch signal generators 816 and 818 respond in the same manner as previously described and shown for latch signal generators 812 and 814 in clock cycles 3 and 4 respectively. At the beginning of clock cycle 5, RST is pulsed to the high logic level to end the operation. In response to the RST pulse, all the latch signal generators reset and drive their outputs to a null value, such as the low logic level for example.

In summary, once initiated by the STRT signal, each latch signal generator provides a clock pulse from its Q1 output in each clock cycle, while enabling enable the next latch signal generator for a subsequent clock cycle. This cascaded generation of clock pulses continues while the reset signal RST is at the inactive low logic level. Therefore each register is enabled in sequence to latch the VPS configuration codes asserted on VPS_DB during the corresponding clock cycle. In this particular example of the embodiment, the signal STRT can be provided by logic and op-code converter block 414 in response to the VPS configuration op-code provided in the VPS configuration command. Since the duration of the strobe signal CSI is directly related to the size of the VPS configuration command, the falling edge of CSI can be used in one example embodiment to trigger the generation of the RST pulse that ends the operation. With reference to FIG. 11A, if the VPS configuration command ended with VPS2 for configuration Bank 2, then CSI is de-asserted, or driven to the low logic level after the last bit of VPS2 is latched. Simple logic can be implemented by any person skilled in the art to generate the RST pulse in response to the falling edge of CSI.

Figure 13:
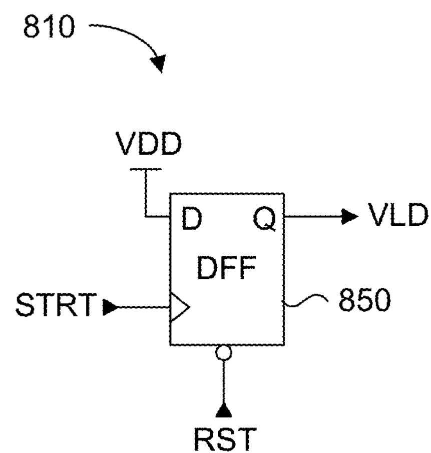
FIG. 13 is a circuit schematic of the seed signal generator of FIG. 12A.

The seed signal generator and the latch signal generators shown in FIG. 12A have been functionally described to provide signals having timing characteristics in response to input signals. The timing relationship has been shown by the example sequence diagram illustrated in FIG. 12B. Persons of skill in the art should understand that a variety of logic circuits can be developed for generating these signals in response to the shown input signals. FIG. 13 is a circuit schematic example of a possible seed signal generator 810 of FIG. 12A, while FIG. 14 is a circuit schematic example of a possible latch signal generator (812, 814, 816 or 818) of FIG. 12A.

The seed signal generator 810 of FIG. 13 includes a known D-type flip-flop register 850 having a D input, a clock input, a reset input and a Q output. To generate the seed signal VLD, the D input is tied to VDD which is latched in response to STRT provided to the clock input. Therefore in response to the STRT high logic level pulse, VLD is driven to the high logic level of VDD. When RST is pulsed to the high logic level, the circuit is reset and VLD is driven to the low logic level of VSS.

Figure 14:
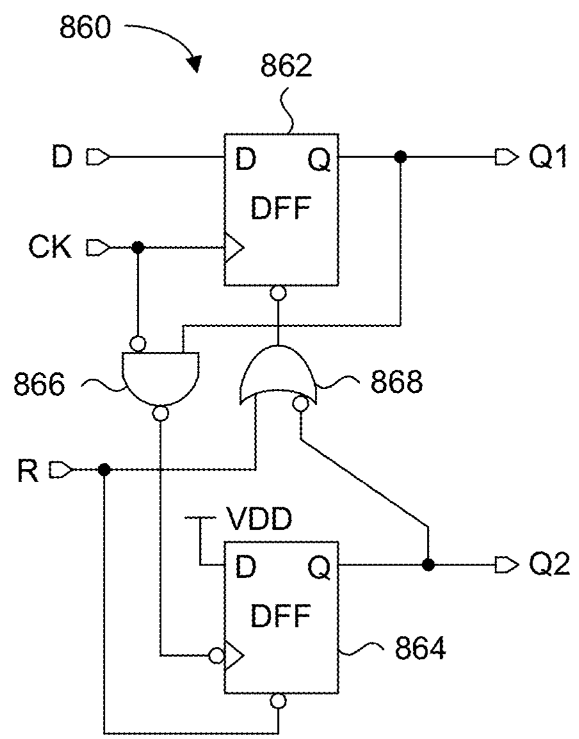
FIG. 14 is a circuit schematic of a latch generator circuit of FIG. 12A, according to a present embodiment; and, FIG. 15 is a flow chart of a method for configuring virtual page sizes of memory in a bridge device, according to a present embodiment.

FIG. 14 is a circuit schematic of one latch signal generator shown in FIG. 12A. Latch signal generator 860 includes two D-type flip-flop registers 862 and 864, a NAND logic gate 866 and an OR logic gate 868. The inputs and outputs of the latch signal generators shown in FIG. 12A are referred to as input and output ports. Flip-flop register 862 has a D input connected to the D input port, a clock input connected to the CK input port, a reset input connected to the R input port via OR gate 868, and a Q output connected to the Q1 output port. Therefore, flip-flop register 862 latches a high logic level signal appearing on the D input port, and drives its Q output to the high logic level in response to the rising edge of a signal appearing on the CK input port. NAND logic gate 866 has an inverting input connected to the CK input port, and a non-inverting input connected to the Q output of flip-flop register 862. The output of NAND logic gate 866 is provided to flip-flop register 864. In this configuration, NAND logic gate 866 detects a condition where Q1 is at the high logic level and CK is at the low logic level. Under this condition, the output of NAND logic gate 866 is driven to the low logic level.

Flip-flop register 864 has its D input connected to the VDD power supply, which corresponds to the high logic level, an inverting clock input connected to the output of NAND logic gate 866, a reset input connected to the R input port, and a Q output connected to the Q2 output port. Flip-flop register 864 latches Q2 to the high logic level when NAND logic gate 866 detects Q1 at the high logic level while CK is at the low logic level. As previously mentioned, Q2 enables the next downstream latch signal generator it may be connected to. OR logic gate 868 has an inverting input connected to the Q output of flip-flop register 864, an a non-inverting input connected to the R input port, and an output connected to the reset input of flip-flop register 862. The output of OR logic gate 868 is driven to the low logic level when Q2 is driven to the high logic level by flip-flop register 864, or when the R input port is at the high logic level. OR logic gate 868 forms a feed-back path from flip-flop register 864 to flip-flop register 862, in which flip-flop register 862 is reset when output port Q2 is at the high logic level.

In summary, when the D input port is at the high logic level, Q1 is driven to the high logic level in response to the signal received at the CK input port at the high logic level. Q1 is driven from the high logic level to the low logic level when the signal received on the CK input port drops to the low logic level. Furthermore, flip-flop register 864 maintains output port Q2 at the high logic level for all subsequent clock cycles until it is reset. With output port Q2 maintained at the high logic level, flip-flop register 862 is maintained in the reset state, thereby locking out the CK input port from latching and driving Q1 on the next rising edge appearing on the CK input port.

The presently described example assumes that all data bits of each VPS configuration code are asserted onto VPS_DB at the same time. This means that bridge device is configured to receive all VPS configuration code data bits at the same time, or in one clock cycle. For example, if each VPS configuration code is 8 bits in size, then bridge device input/output interface 402 can have 8 D[j] ports (where j=8). In an alternate example, if bridge device input/output interface 402 has 4 D[j] ports, then all 8 bits of the VPS configuration code are received after 2 clock cycles, since 4 bits are provided each clock cycle. Therefore, a portion of the data corresponding to one VPS configuration code is latched each clock cycle, where the portion depends on the number of D[j] ports that are being used to receive the data. In such a configuration, the circuit of FIG. 12A is simply scaled such that register 800 latches the first 4 bits on the first clock cycle, and register 802 latches the last 4 bits on the second clock cycle. Hence additional latch signal generators are added to domino activation logic 808 and the registers are re-arranged to receive the appropriate clock pulses. Therefore, any combination of VPS configuration code size and bridge device input/output interface can be used, depending on the application requirements.

The VPS configurator 422 of FIG. 12A is a simple circuit for quickly latching the VPS configuration code in the VPS configuration command. With reference to FIG. 7, since the memory banks 518 are ordered from a least significant bank to a most significant bank, the most significant bank and its corresponding NAND flash memory device can be designated as the one that has its VPS configuration changed least frequently. Then, the least significant bank and its corresponding NAND flash memory device can be designated as the one that has its VPS configuration changed most frequently to take advantage of the VPS configuration command structure. If the least significant bank has its VPS configuration changed frequently, then the commands are minimally sized by including only the first VPS data field corresponding to VPS configuration code VPS0. By having minimally sized VPS configuration commands that are frequently issued, overall performance is improved as less time is required by each composite memory device to receive and process the command.

Figure 15:
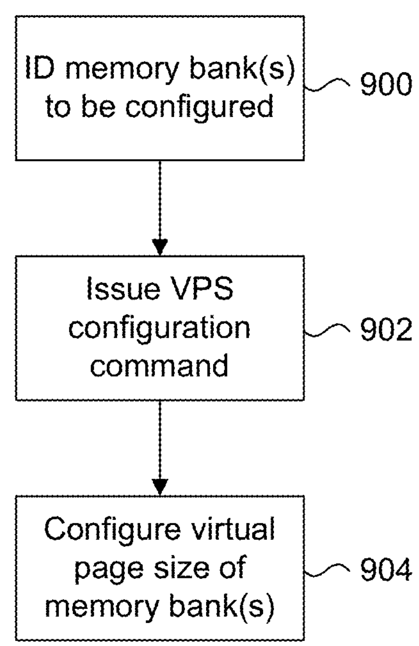

Following is a summary of a method for configuring the virtual page size of memory banks of a composite memory device in a memory system having at least one composite memory device, according to a present embodiment. Such a memory system can have the memory system configuration previously shown in FIG. 5, where each composite memory device has the bridge device 400 shown in FIG. 6. The method is shown in the flow chart of FIG. 15, which starts at step 900 by having the memory controller identify at least one memory bank of the memory banks in bridge device 400 to be configured with a specific virtual page size. As previously mentioned, the memory banks can be ordered from the least significant to the most significant memory banks. The memory controller may act on a request from the host system within which the memory system is used for setting up the virtual page sizes. Alternately, the memory controller may automatically follow an algorithm depending on the types of data that the host system could store within the memory system. Once the memory bank or memory banks to be configured have been identified and their virtual page sizes have been assigned, the memory controller issues a VPS configuration command at step 902, having a header and a data payload consisting of only the VPS configuration codes corresponding to the memory banks to be configured. In the present embodiment, only the VPS configuration codes corresponding to the least significant memory bank up to the highest significant memory bank being configured are included in the data payload of the VPS configuration command. In the present embodiment, these VPS configuration codes are issued in increasing order of significance in relation to their corresponding memory banks.

In the presently described system, a CSI strobe signal is provided with the VPS configuration command. The CSI strobe signal is driven to a high logic level at the beginning of the header and is then driven to a low logic level at the end of the data payload, which is the last bit or bits of the highest significant VPS configuration code. The result of step 902 is shown by example in FIG. 11A or 11B. Because the header of the VPS configuration command includes a GDA field, the present command is therefore issued to a selected composite memory device. The first composite memory device determines via its bridge device, if its assigned device address matches the address in the GDA field of the VPS configuration command. In the case of a mismatch, the bridge device ignores the op-code and the VPS configuration command is relayed by the composite memory device to the subsequent composite memory device in the system. Eventually the selected composite memory device has a device address that matches the address in the GDA field. In response to the matching address, the bridge device decodes the op-code and proceeds to latch the VPS configuration codes in step 904. Once latched, the virtual page sizes of the banks are configured. In the present embodiments, the latching of the VPS configuration codes ends when CSI drops to the inactive low logic level. Therefore, the VPS configuration command does not need to include any further information indicating the number of VPS configuration codes that are in the data payload. Because the logical ordering of the memory banks is predetermined, the VPS configuration codes are provided with the same logical ordering. Therefore the configuration command does not need to include any information indicating which VPS configuration code should be matched with which memory bank.

Because the size of the data payload depends on the highest significant memory bank being configured, there may be lesser significant memory banks where the memory bank virtual page size remains unchanged. However, because the VPS configuration command includes all VPS configuration codes corresponding to the least significant memory bank up to the highest significant memory bank being configured, VPS configuration codes corresponding to the previous virtual page size of the unchanged memory banks are issued. Therefore, the previous VPS configuration code is overwritten with the same VPS configuration code, and no change to the virtual page size for the corresponding memory bank is made.

The presently described embodiments show how virtual page sizes for memory banks in a bridge device can be configured. The previously described circuits, command format and methods can be used in any semiconductor device having a memory which has a virtual or logical size configurable to suit application requirements.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention.

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Certain adaptations and modifications of the described embodiments can be made. Therefore, the above-discussed embodiments are considered to be illustrative and not restrictive.

What is claimed is:

1. A bridge device, comprising:

a virtual page buffer for storing data;

a bridge device interface for transferring data between an external device and the virtual page buffer at a first data rate in response to a global command; and, a memory device interface for transferring data between a memory device and the virtual page buffer at a second data rate different than the first data rate in response to a local command.

2. The bridge device of claim 1, wherein the memory device includes a page buffer having a fixed maximum size.

3. The bridge device of claim 1, wherein the first data rate is greater than the second data rate.

4. The bridge device of claim 1, wherein the memory device interface is asynchronous and the bridge device interface is a synchronous interface receiving a clock signal.

5. The bridge device of claim 1, wherein the memory device interface provides the local command in a parallel format, and the bridge device interface receives the global command in a serial format.

6. The bridge device of claim 1, further including data path circuits for transferring data between the bridge device interface and the virtual page buffer at the first data rate.

7. The bridge device of claim 6, wherein the data path circuits includes a data input path circuit for transferring write data received at the bridge device interface to the virtual page buffer for storage in the virtual page buffer, and a data output path circuit for transferring read data stored in the virtual page buffer to the bridge device interface.

8. The bridge device of claim 7, wherein the virtual page buffer includes a memory having a first input port for receiving the write data from the data input path circuit, a first output port for providing the read data to the data output path circuit, a second input port for receiving the read from the memory device interface, and a second output port for providing the write data stored in the memory.

9. The bridge device of claim 8, further including a converter circuit for receiving the write data from the second output port of the memory and generating the local command to transfer the write data to the memory device.

10. A bridge device, comprising:

a memory device interface for receiving read data at a first data rate;

a virtual page buffer for storing the read data received by the memory device interface; and, a bridge device interface for outputting the read data stored in the memory device interface at a second data rate different than the first data rate.

11. A bridge device, comprising:

a bridge device input/output interface for receiving write data at first data rate;

a virtual page buffer for storing the write data received by the bridge device interface; and, a memory device interface for outputting the write data stored in the virtual page buffer at a second data rate different than the first data rate.

* * * * *